US010680125B2

(12) United States Patent
Huang et al.

(10) Patent No.: US 10,680,125 B2
(45) Date of Patent: Jun. 9, 2020

(54) IRON PYRITE NANOCRYSTALS

(71) Applicant: NUtech Ventures, Lincoln, NE (US)

(72) Inventors: Jinsong Huang, Lincoln, NE (US);
Baodong Mao, Lincoln, NE (US);
Christopher Exstrom, Kearney, NE (US)

(73) Assignee: NUtech Ventures, Lincoln, NE (US)

( * ) Notice: Subject to any disclaimer, the term of this patent is extended or adjusted under 35 U.S.C. 154(b) by 778 days.

(21) Appl. No.: 13/678,039

(22) Filed: Nov. 15, 2012

(65) Prior Publication Data

US 2013/0119346 A1 May 16, 2013

Related U.S. Application Data

(60) Provisional application No. 61/559,943, filed on Nov. 15, 2011.

(51) Int. Cl.
*B82Y 30/00* (2011.01)
*C01G 49/12* (2006.01)
*B82Y 40/00* (2011.01)
*H01L 31/0264* (2006.01)
*H01L 31/18* (2006.01)
*H01L 31/072* (2012.01)

(52) U.S. Cl.
CPC .......... *H01L 31/0264* (2013.01); *B82Y 30/00* (2013.01); *C01G 49/12* (2013.01); *H01L 31/072* (2013.01); *H01L 31/18* (2013.01); *B82Y 40/00* (2013.01); *C01P 2002/72* (2013.01); *C01P 2002/82* (2013.01); *C01P 2004/03* (2013.01); *C01P 2004/38* (2013.01); *C01P 2004/62* (2013.01); *C01P 2004/64* (2013.01); *Y02E 10/50* (2013.01)

(58) Field of Classification Search
CPC ......... B82Y 30/00; B82Y 40/00; H01L 31/18; H01L 31/0264; H01L 31/072; Y02E 10/50; Y02E 10/542; Y02E 10/549; C01P 2004/03; C01P 2004/38; C01P 2004/62; C01P 2004/64; C01P 2002/72; C01P 2002/82; C01G 49/12
See application file for complete search history.

(56) References Cited

U.S. PATENT DOCUMENTS

| | | | |
|---|---|---|---|
| 4,148,975 A | 4/1979 | Schneider et al. | |
| 2003/0107099 A1* | 6/2003 | La Vecchia | H01L 31/0321 257/439 |
| 2009/0087374 A1 | 4/2009 | Schimek et al. | |

(Continued)

FOREIGN PATENT DOCUMENTS

CN 101045985 A * 10/2007

OTHER PUBLICATIONS

Yongjun Feng and Nicolas Alonso-Vante, Nonprecious metal catalysts for the molecular oxygen-reduction reaction, Aug. 8, 2008, pp. 1792-1806.*

(Continued)

*Primary Examiner* — Mayla Gonzalez Ramos
(74) *Attorney, Agent, or Firm* — Fish & Richardson P.C.

(57) ABSTRACT

An apparatus includes a nanocrystal. The nanocrystal includes a core including $FeS_2$; and a coating including a ligand component capable of chemically interacting with both an iron atom and a sulfur atom on a surface of the core.

27 Claims, 20 Drawing Sheets

(56) References Cited

U.S. PATENT DOCUMENTS

| | | | | |
|---|---|---|---|---|
| 2011/0240108 A1* | 10/2011 | Law et al. | | 136/255 |
| 2013/0037111 A1* | 2/2013 | Mitzi | | H01L 31/0326 |
| | | | | 136/264 |
| 2014/0205756 A1* | 7/2014 | Law et al. | | 427/374.1 |

OTHER PUBLICATIONS

Yu Bi, Yongbo Yuan, Christopher L. Exstrom, Scott A. Darveau, and Jinsong Huang, Air Stable, Photosensitive, Phase Pure Iron Pyrite Nanocrystal Thin Films for Photovoltaic Application, Oct., 2011, pp. A-E.*

Bausch et al., "Preparation of Pyrite Films by Plasma-Assisted Sulfurization of Thin Iron Films," *Applied Physics Letters*, 1990, 57(1):25-27.

Bi et al., "Air Stable, Photosensitive, Phase Pure Iron Pyrite Nanocrystal Thin Films for Photovoltaic Application," *Nano Lett.*, 2011, 11:4953-4957.

Bouchard, "The Preparation of Single Crystals of $FeS_2$, $CoS_2$, and $NiS_2$ Pyrites by Chlorine Transport," *Journal of Crystal Growth*, 1962, 2(1):40-44.

Brayner et al., "Ecotoxicological Studies of CdS Nanoparticles on Photosynthetic Microorganisms," *J Nanosci. Nanotech.*, 2011, 11:1852-1858.

Buker et al., "Photovoltaic output limitation of n-$FeS_2$ (pyrite) Schottky barriers: A temperature-dependent characterization," *J. Appl. Phys.*, 1992, 72:5721-5728.

Cotton et al., "The Effect of Complex-Formation by Phosphine Oxides on Their P—O Stretching Frequencies," *J Chem Soc*, May 1960, 2199-2203.

Dasbach et al., "Iron Sulfide for Photovoltaics," *MRS Bulletin*, 1993, 18(10):56-60.

Ellmer and Tributsch, "Iron Disulfide (Pyrite) as Photovoltaic Material: Problems and Opportunities," Proceedings of the 12th Workshop on Quantum Solar Energy Conversion—(QUANTSOL 2000).

Ennaoui et al., "Iron Disulfide for Solar Energy Conversion," *Solar Energy Materials and Solar Cells*, 1993, 29(4):289-370.

Ennaoui et al., "Photoactive Synthetic Polycrystalline Pyrite ($FeS_2$)," *J. Electrochem. Soc.*, 1985, 132:1579.

Ennaoui et al., "Preparation of Iron Disulfide and Its Use for Solar Energy Conversion," *World Renewable Energy Congress. Energy and the Environment*, Pergamon Press, 1990, 458.

Ferrer et al., "About the band gap nature of $FeS_2$ as determined from optical and photoelectrochemical measurements," *Solid State Commun*, 1990, 74(9):913-916.

Fukui et al., "Photoconductivity of Natural Pyrite ($FeS_2$)," *J Phys Soc Jpn*, 1971, 31(4):1277.

Hines and Guyot-Sionnest, "Bright UV-Blue Luminescent Colloidal ZnSe Nanocrystals," *J Phys Chem B*, 1998, 102(19):3655-3657.

Lalvani et al., "Characterization of semiconducting properties of naturally occurring polycrystalline $FeS_2$ (Pyrite)," *J Mater Sci*, 1990, 25(1A):107-112.

Lin et al., "Extended red light harvesting in a poly(3-hexylthiophene)/ iron disulfide nanocrystal hybrid solar cell," *Nanotechnology*, 2009, 20(40):5207.

Liu et al., "Growth of $Cu_2S$ Ultrathin Nanowires in a Binary Surfactant Solvent," *Phys. Chem. B*, 2005, 109:10699-10704.

Malik et al., "Synthesis of TOPO-capped Mn-doped ZnS and CdS quantum dots," *J. Mater. Chem.*, 2001, 11:2382-2386.

Masset and Guidotti, "Thermal activated ("thermal") battery technology: Part IIIa: $FeS_2$ cathode material," *J Power Sources*, 2008, 177(2):595-609.

Murphy and Strongin, "Surface Reactivity of Pyrite and Related Sulfides," *Surface Science Reports*, 2009, 64(1):1-45.

Niezgoda et al., "Novel Synthesis of Chalcopyrite $Cu_xIn_yS_2$ Quantum Dots with Tunable Localized Surface Plasmon Resonances," *Chem. Mater.*, 2012, 24:3294-3297.

Nyamen et al., "Synthesis of anisotropic PbS nanoparticles using heterocyclic dithiocarbamate complexes," *Dalton Transactions*, 2012, 41:8297-8302.

Oertel et al., "Growth of n-type polycrystalline pyrite ($FeS_2$) films by metalorganic chemical vapour deposition and their electrical characterization," *Journal of Crystal Growth*, 1999, 198:1205-1210.

Puthussery et al., "Colloidal Iron Pyrite ($FeS_2$) Nanocrystal Inks for Thin-Film Photovoltaics," *J. Am. Chem. Soc.*, 2011, 133:716-719.

Schieck et al., "Electrical Properties of Natural and Synthetic Pyrite ($FeS_2$) Crystals," *J Mater Res*, 1990, 5(7):1567-1572.

Smestad et al., "Photoactive thin film semiconducting iron pyrite prepared by sulfurization of iron oxides," *Sol Energy Mater*, 1990, 20(3):149-165.

Smestad et al., "Formation of Semiconducting Iron Pyrite by Spray Pyrolysis," *Sol Energ Mater*, 1989, 18(5):299-313.

Sun and Ceder, "Feasibility of band gap engineering of pyrite $FeS_2$," *Phys. Rev. B*, 2011, 84:1-7.

Wang et al., "Solution-Processable Pyrite $FeS_2$ Nanocrystals for the Fabrication of Heterojunction Photodiodes with Visible to Nir Photodetection," *Adv. Mater.*, 2012, 24:3415-3420.

\* cited by examiner

IRON PYRITE NANOCRYSTALS

CROSS-REFERENCE TO RELATED APPLICATIONS

This application claims priority under 35 USC § 119(e) to U.S. Patent Application Ser. No. 61/559,943, filed on Nov. 15, 2011, the entire contents of which are hereby incorporated by reference.

BACKGROUND

Iron pyrite is a naturally abundant and nontoxic photovoltaic material that is attractive as a photovoltaic material, e.g., due to its high absorption coefficient ($\sim 5 \times 10^5$ cm$^{-1}$) and energy band gap ($\sim 0.95$ eV) suitable for photovoltaic energy conversion. The estimated highest attainable efficiency of pyrite photovoltaic films is as high as that for single crystal silicon. Pyrite is thus an attractive material for use in inexpensive photovoltaic cells.

SUMMARY

Ligand-stabilized iron pyrite nanocrystals are phase pure, highly crystalline, and stable against degradation in air are synthesized and characterized. The purity and substantial absence of surface defects in iron pyrite nanocrystals allows the iron pyrite nanocrystals to retain semiconducting properties. Films of these high purity nanocrystals exhibit high carrier mobility and strong photoconductivity at room temperature and are well suited to use in photovoltaic applications such as solar cells.

In a general aspect, an apparatus includes a nanocrystal. The nanocrystal includes a core including FeS$_2$; and a coating including a ligand component capable of chemically interacting with both an iron atom and a sulfur atom on a surface of the core.

Embodiments may include one or more of the following.
The ligand component includes a phosphine oxide group.
The ligand component includes trioctylphosphine oxide (TOPO).
The nanocrystal is stable against oxidation in air, e.g., for at least one year.
A chemical composition of the nanocrystal is stable for at least one year.
The nanocrystal is a semiconductor.
A band gap of the nanocrystal is at least about 0.9 eV.
The core includes zinc. In some cases, a band gap of the nanocrystal is dependent on a ratio of iron to zinc in the core. In some cases, a band gap of the nanocrystal is at least about 1.2 eV.
The nanocrystal is substantially cubic.
A size of the nanocrystal is between about 10 nm and about 200 nm.
The nanocrystal is soluble in an organic solvent.

In a general aspect, a method of making nanocrystals includes forming a reaction solution including an iron-containing precursor, a sulfur-containing precursor, and a ligand component. The method also includes heating the reaction solution to generate nanocrystals having a core including FeS$_2$ and a coating including the ligand component, wherein the ligand component is capable of chemically interacting with both an iron atom and a sulfur atom on a surface of the core.

Embodiments may include one or more of the following.
The ligand component includes a phosphine oxide group.
The ligand component includes TOPO.
Forming the reaction solution includes forming a first solution including the iron-containing precursor and the ligand component; heating the first solution; and adding the sulfur-containing precursor to the first solution to form the reaction solution. In some cases, heating the first solution includes heating the first solution to about 170° C.
Heating the reaction solution includes heating the reaction solution to about 220° C.
The reaction solution includes oleylamine (OLA).
The iron-containing precursor is FeCl$_2$.
The reaction solution includes a zinc-containing precursor. The core of the nanocrystals includes zinc. In some cases, the zinc-containing precursor is zinc acetate.
The method includes controlling a size of the nanocrystals based on at least one of a temperature to which the reaction solution is heated, a ratio of iron to sulfur in the reaction solution, and a concentration of iron and sulfur in the reaction solution.
A size of the nanocrystals is between about 10 nm and about 200 nm.

In a general aspect, a structure includes a substrate; and a layer of nanocrystals disposed on the substrate. Each nanocrystal includes a core including FeS$_2$, and a coating including a ligand component capable of chemically interacting with both an iron atom and an sulfur atom on a surface of the core.

Embodiments may include one or more of the following.
The ligand component includes a phosphine oxide group.
The ligand component includes TOPO.
The layer of nanocrystals is stable against oxidation in air.
A chemical composition of the layer of nanocrystals is stable for at least one year.
A carrier mobility of the layer of nanocrystals is at least about 80 cm$^2$/Vs.
The layer of nanocrystals is photoconductive.
The core includes zinc.
The layer of nanocrystals is a monolayer of nanocrystals.
The layer of nanocrystals has a thickness of about 400 nm.
The layer of nanocrystals has a thickness of up to about 1 micrometer.
The substrate is an electrically conductive substrate.
The layer of nanocrystals is disposed on the substrate via at least one of spin coating, dip coating, roll coating, or printing.
The structure includes an electrical contact disposed on the layer of nanocrystals.

In a general aspect, a device includes an electrically conductive substrate; a layer of photoconductive nanocrystals including FeS$_2$ disposed on the substrate; and an electrical contact disposed on the layer of nanocrystals.

Embodiments may include one or more of the following.
When the layer of nanocrystals is illuminated, an increase in current of about 12 times occurs.
A dark current in the layer of nanocrystals is less than about 50 mA/cm$^2$.
A carrier mobility of the layer of nanocrystals is at least about 80 cm$^2$/Vs.
The nanocrystals include zinc.
The nanocrystals include a core including FeS$_2$; and a coating including a ligand component capable of chemically interacting with both an iron atom and a sulfur atom on a surface of the core. In some cases, the ligand component includes a phosphine oxide group. In some cases, the ligand component is TOPO.

The core includes zinc.

The layer of nanocrystals is stable against oxidation in air.

A chemical composition of the layer of nanocrystals is stable for at least one year.

The device is a photovoltaic cell.

The techniques described herein have a number of advantages. For example, phase pure, highly crystalline iron pyrite nanocrystals can be synthesized that are stable in air against oxidation and degradation for at least one year. These iron pyrite nanocrystals have optoelectronic properties suitable for photovoltaic applications. Photovoltaic devices formed of iron pyrite can be inexpensive and efficient.

Other features and advantages are apparent from the following description and from the claims.

BRIEF DESCRIPTION OF DRAWINGS

FIG. 17 is a schematic diagram of an example photovoltaic device.

DETAILED DESCRIPTION

Figure 1:
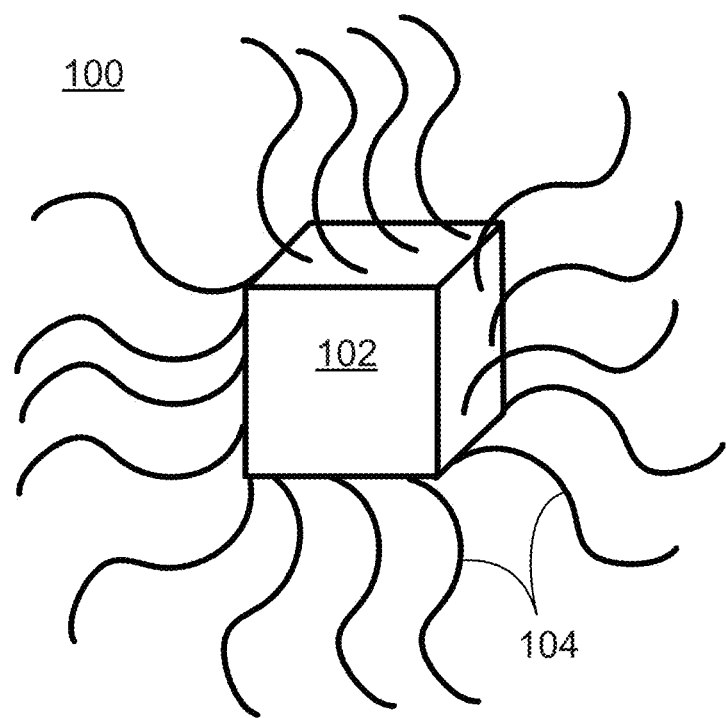
FIG. 1 is a diagram of an iron pyrite nanocrystal.

Referring to FIG. 1, an iron pyrite $FeS_2$ nanocrystal 100 includes a core 102 of iron pyrite surrounded by ligand molecules 104. The ligand molecules 104 passivate both iron and sulfur molecules on the surface of the core 102, thus preventing oxidation and surface decomposition of the nanocrystals. As a result, ligand-stabilized iron pyrite nanocrystals 100 are phase pure, highly crystalline, and stable against degradation in air.

The purity and substantial absence of surface defects in iron pyrite nanocrystals 100 allows the iron pyrite nanocrystals 100 to retain semiconducting properties. Films of these high purity nanocrystals 100 exhibit high carrier mobility and strong photoconductivity at room temperature and are well suited to use in photovoltaic applications such as solar cells.

1 Synthesis and Characterization of Iron Pyrite Nanocrystals

Iron pyrite ($FeS_2$) nanocrystals stabilized (e.g., coated) with a ligand, such as trioctylphosphine oxide (TOPO), were prepared using a two-step solution-based synthesis process. In general, an iron-containing compound is combined with the ligand in a coordinating solvent, such as oleylamine (OLA) to form a soluble Fe precursor species. A solution of sulfur in a solvent, such as OLA, is added to the Fe precursor solution and allowed to react, yielding pure phase, monodisperse cubic iron pyrite ($FeS_2$) nanocrystals stabilized by ligand molecules.

In the examples given below, TOPO-stabilized iron pyrite nanocrystals were synthesized and characterized. However, other ligands may also be used in the synthesis of iron pyrite nanocrystals. Example ligands include other molecules including a phosphine oxide group, such as triphenylphosphine oxide or phospholipids such as L-α-Phosphatidylcholine, 1,2-bis(10,12-tricosadiynoyl)-sn-Glycero-3-phosphocholine, or 1,2-Dipropionoyl-sn-Glycero-3-Phosphocholine. Other example ligands include, e.g., oleylamine, octadecylamine, thiol molecules (e.g., —C—SH or R—SH), xanthate molecules (e.g., $ROCS_2^-M^+$), polyvinylpyrrolidone, polyvinyl alcohol, and other ligand molecules.

Figure 2:
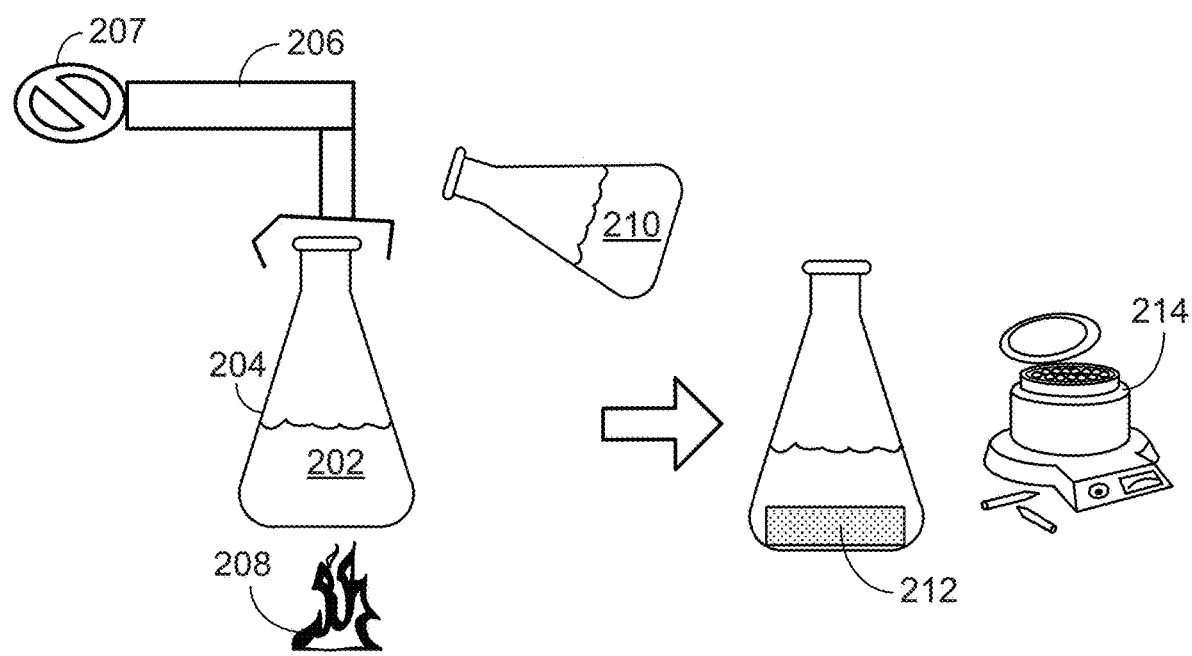
FIG. 2 is a diagram of an example system for making iron pyrite nanocrystals.

FIG. 2 shows an example system 200 for synthesizing ligand-stabilized iron pyrite nanocrystals. A solution 202 of an iron-containing compound and a molar excess of a ligand is formed in a reaction vessel 204 in an inert atmosphere or under vacuum, e.g., using a Schlenk line 206 and a vacuum pump 207. The iron-containing solution 202 is heated by a heat source 208 to form an iron precursor species. A solution 210 containing a molar excess of sulfur (in relation to the iron-containing compound) is added to the iron precursor solution. The iron-sulfur solution is heated by the heat source 202 to facilitate nanocrystal growth in the reaction mixture. The reaction is quenched, e.g., by removal from the heat source 208, and the nanocrystals are precipitated from the reaction mixture to form a precipitate 212. The precipitated nanocrystals are cleaned and purified by washing with solvents, such as chloroform and methanol, and by centrifugation using a centrifuge 214.

In an example process, TOPO-stabilized iron pyrite nanocrystals were synthesized under a nitrogen atmosphere using standard Schlenk line techniques. 0.05 mmol of anhydrous Iron (II) chloride ($FeCl_2$ (99.9%), Sigma-Aldrich, St. Louis, Mo.) and 3 mmol of TOPO (Sigma-Aldrich) were dissolved in 10 mL OLA (Acros, Geel, Belgium). The iron-containing solution was degassed by nitrogen bubbling for 60 minutes to remove oxygen and water. The solution was then heated to 170° C. and allowed to remain at that temperature for three hours to allow an iron precursor species to form. A solution of 3 mmol sulfur (98%, Sigma-Aldrich) dissolved in 5 mL OLA was injected into the iron-containing solution. The mixture was heated to 220° C. and allowed to remain at that temperature for two hours to facilitate nanocrystal growth. The reaction was then quenched by removing the heat source and the reaction mixture was cooled to room temperature. The as-prepared nanocrystals were precipitated from the reaction mixture by the addition of excess methanol (Sigma-Aldrich) and isolated by centrifugation. Three times, the nanocrystals were washed with a mixture of methanol and anhydrous chloroform (Sigma-Aldrich) followed by centrifugation. The cleaned nanocrystals were redispersed into chloroform for storage.

The chloroform solution of TOPO-stabilized nanocrystals remained stable and well-dispersed after isolation without any further post-reaction treatment for at least two months without obvious particle aggregation or sedimentation.

Figure 3:
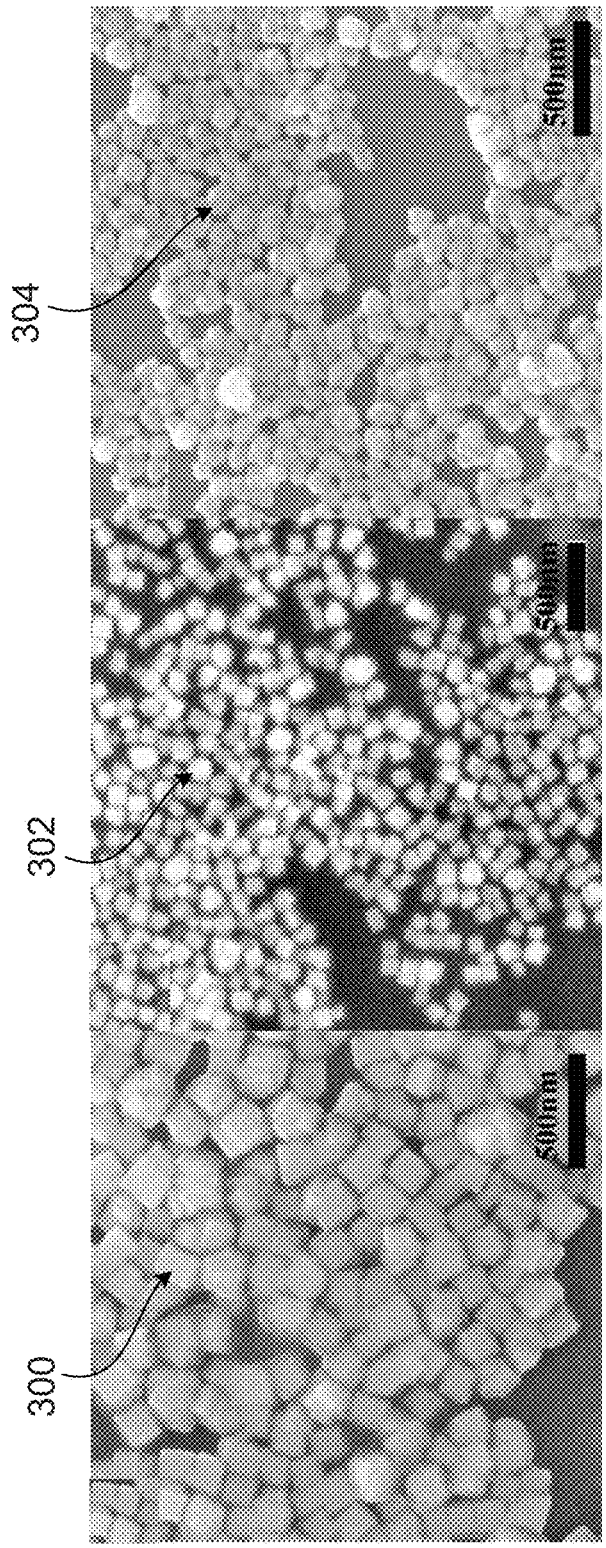
FIGS. 3A-3C are scanning electron microscopy (SEM) images of iron pyrite nanocrystals yielded from reactions with various amounts of trioctylphosphine oxide (TOPO).

The iron pyrite nanocrystals yielded from this reaction are cubic in shape and have a size of about 200 nm (e.g., as shown in FIG. 3A). This size is larger than that of other colloidal nanocrystals, such as PbS and CdSe nanocrystals, indicating that the iron pyrite nanocrystals have suitable ligands passivating the surface.

The size of the nanocrystals synthesized by this reaction can be controlled via the concentration of the ligand in the reaction mixture. For instance, the size of TOPO-stabilized iron pyrite nanocrystals can range from about 10 nm to about 200 nm. FIGS. 3A-3C are scanning electron microscopy (SEM) images of iron pyrite nanocrystals synthesized with varying amounts of TOPO, demonstrating the ability to control the size of the nanocrystals. FIG. 3A is an image of ~200 nm cubic iron pyrite nanocrystals 300 yielded from a reaction having 3 mmol of TOPO. When the amount of TOPO was decreased to 0.3 mmol (for the same quantity of $FeCl_2$ and S), the size of the yielded cubic nanocrystals 302 decreased to about 60-100 nm (FIG. 3B). With no TOPO added to the reaction system, the yielded nanocrystals 304 were quasi-cubic in shape and about 90 nm in size (FIG. 3C).

A number of characterization techniques were used to characterize the structure, composition, and optical properties of TOPO-stabilized iron pyrite nanocrystals resulting from this synthesis process.

Figure 4:
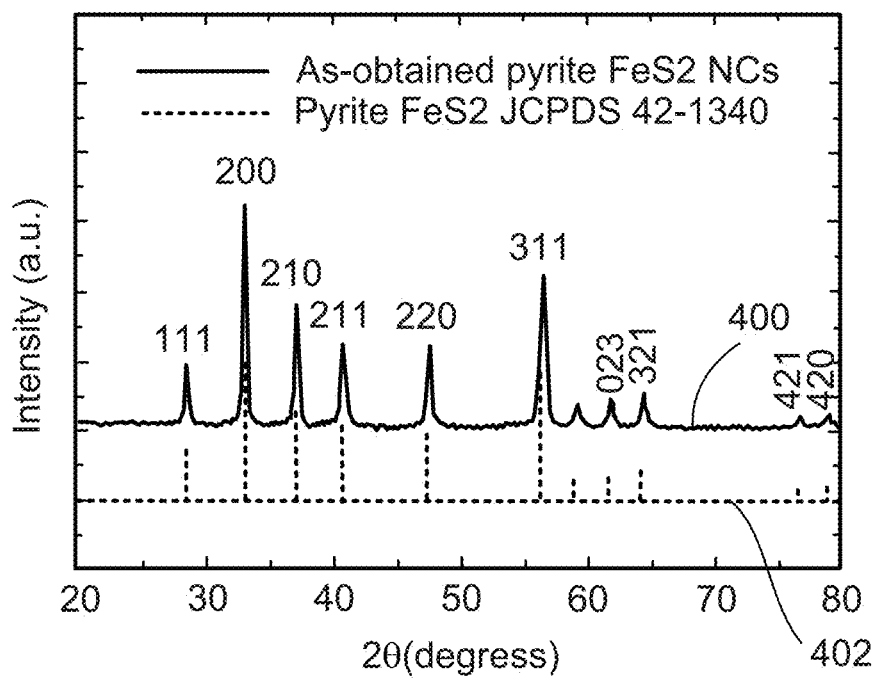
FIG. 4 is a plot of an X-ray diffraction pattern of a film of iron pyrite nanocrystals.

Referring to FIG. 4, to characterize the crystal structure and purity of the nanocrystals, powder X-ray diffraction measurements were conducted on a layer of TOPO-stabilized iron pyrite $FeS_2$ nanocrystals and an X-ray diffraction pattern 400 was obtained. By indexing the diffraction peaks of the pattern 400, the crystal structure of the nanocrystals was identified as a pure pyrite cubic phase of $FeS_2$ (corresponding to a reference pattern 402 no. 42-130 of the Joint Committee on Powder Diffraction Standards (JCPDS)). The sharpness of the diffraction peaks in the pattern 400 indicates a high degree of crystallinity in the nanocrystals. No significant impurity peaks are present in the pattern 400, indicating that the nanocrystals are relatively pure. X-ray diffraction measurements were conducted on a layer of nanocrystals formed by drop casting using a Rigaku (The Woodlands, Tex.) Multiflex X-ray Diffractometer using standard powder X-ray diffraction techniques.

Figure 5:
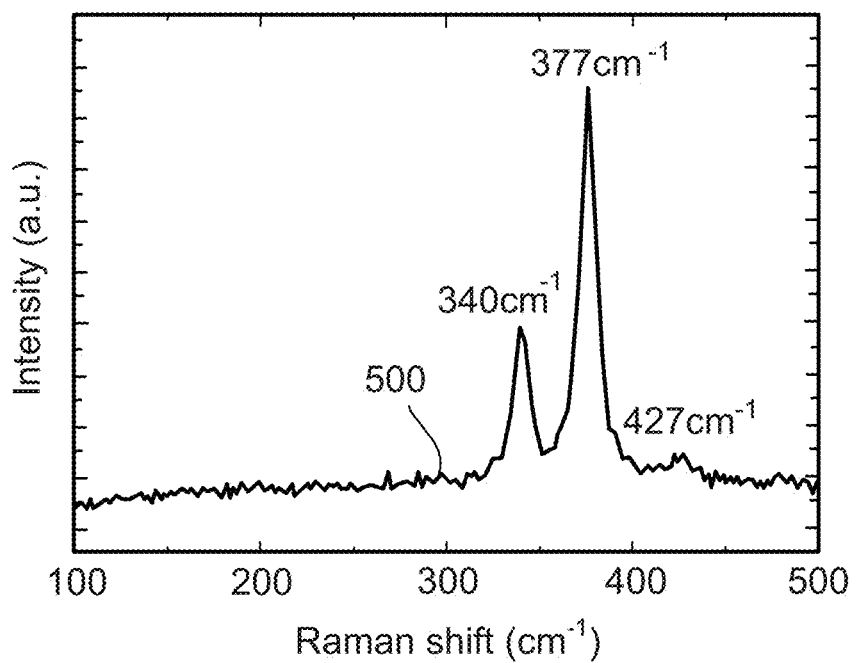
FIG. 5 is a plot of a Raman spectrum of a film of iron pyrite nanocrystals.

Referring to FIG. 5, Raman spectroscopy was conducted to further confirm the phase purity of the TOPO-stabilized iron pyrite $FeS_2$ nanocrystals. Raman spectroscopy is generally capable of distinguishing various iron sulfide phases (e.g., FeS, $Fe_3S_4$, and $FeS_2$) and typically has a lower impurity detection limit than X-ray diffraction. A Raman spectrum 500 was obtained with peaks at 339 $cm^{-1}$, 378 $cm^{-1}$, and 425 $cm^{-1}$, which correspond well to reported values for iron pyrite (i.e., $FeS_2$). Confocal Raman microspectroscopy was carried out on a layer of nanocrystals formed by drop casting using a Renishaw (Gloucestershire, UK) spectrometer with a 514 nm laser.

The phase purity of the nanocrystals was further verified by sensitive magnetic measurements using a superconducting quantum interference device (SQUID). Iron ions in $Fe_{1-x}S$ and $FeS_2$ have a high and low spin state, respectively, with a difference in magnetization of about eight orders of magnitude. Thus, $Fe_{1-x}S$ and $FeS_2$ can be distinguished using SQUID measurements. TOPO-stabilized iron pyrite $FeS_2$ nanocrystals show no magnetism signal to the detection limit of the SQUID, indicating that the concentration of $Fe_{1-x}S$ impurities in the nanocrystals is less than the level of parts per million (ppm).

The purity of a material affects its photoconductive response. Only high quality iron pyrite will exhibit photoconductivity; the presence of defects such as metallic FeS will quench excited photocarriers, eliminating the photoconductivity. The purity and high degree of crystallinity of TOPO-stabilized iron pyrite nanocrystals makes these nanocrystals good candidates for use in photovoltaic applications.

Figure 6:
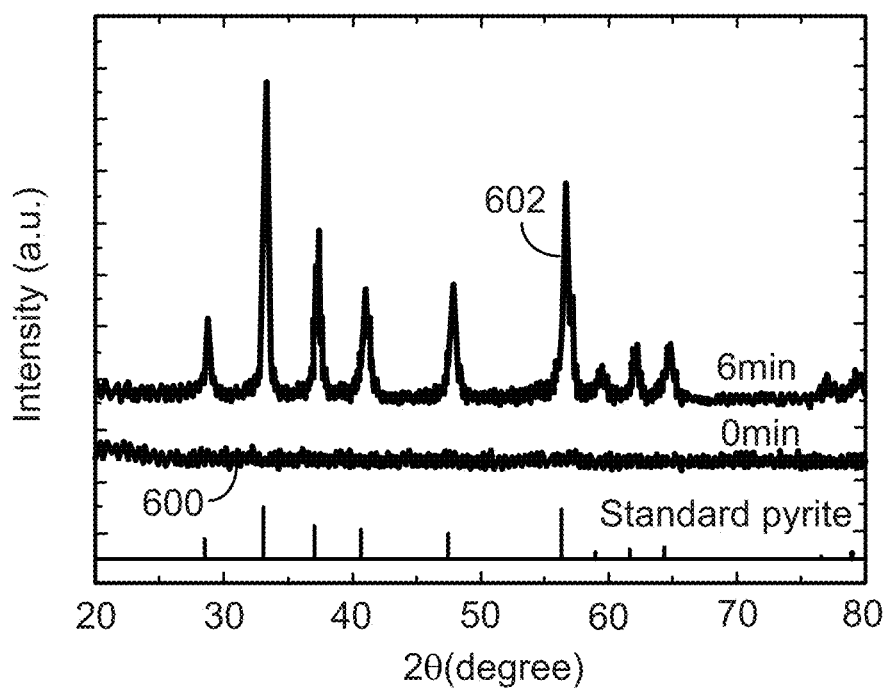
FIG. 6 is a plot of X-ray diffraction patterns of films of iron pyrite nanocrystals yielded from reactions with various reaction times.
Figure 7:
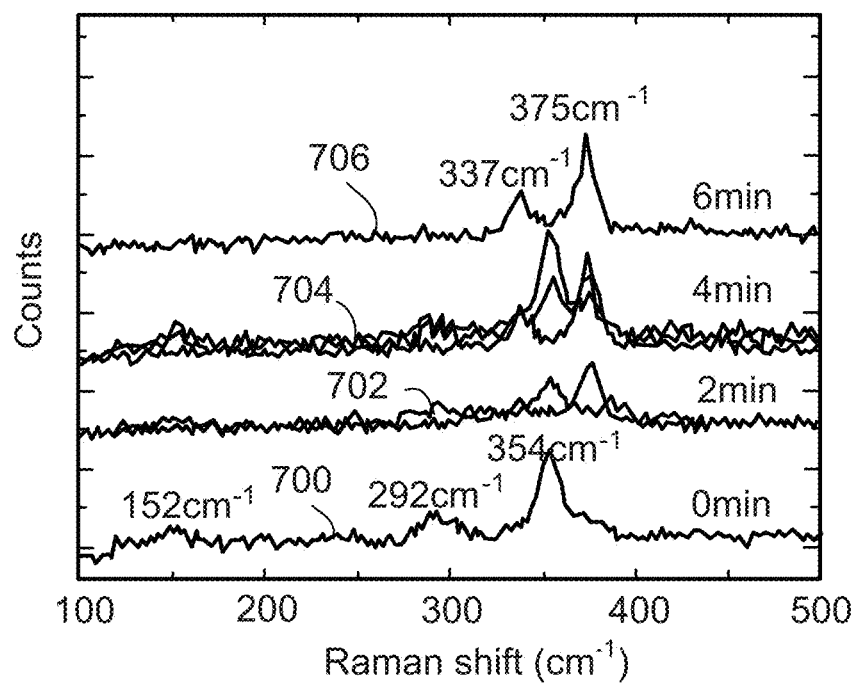
FIG. 7 is a plot of Raman spectra of films of iron pyrite nanocrystals yielded from reactions with various reaction times.

During the TOPO-stabilized iron pyrite $FeS_2$ nanocrystal synthesis reaction, aliquots of reaction mixture were removed and characterized to monitor the evolution of the morphology and composition of the reaction products. FIG. 6 shows X-ray diffraction patterns taken immediately upon injection of sulfur to the reaction mixture (pattern 600) and 6 minutes after the sulfur addition (pattern 602). FIG. 7 shows Raman spectra taken immediately upon sulfur injection (spectrum 700) and 2, 4, and 6 minutes after sulfur addition (spectra 702, 704, 706, respectively). No FeS phase was observed during the reaction, as indicated by the lack of FeS diffraction peaks in the diffraction patterns 600, 602 and by the absence of Raman peaks at 210 $cm^{-1}$ and 280 $cm^{-1}$ in the Raman spectra 700, 702, 704, 706. Raman peaks at 152 $cm^{-1}$, 292 $cm^{-1}$, and 354 $cm^{-1}$ in the early Raman spectra 700, 702, 704 indicate that amorphous $Fe_{1-x}S$ was formed immediately after sulfur injection, and during the first six minutes of the reaction, the reaction product was a mixture of amorphous phase and pyrite $FeS_2$. By 6 minutes after sulfur injection, the amorphous intermediate had been transformed to iron pyrite $FeS_2$, as reflected by the sharp diffraction peaks in the diffraction pattern 602 and the presence of Raman peaks in the 6-minute Raman spectrum 706.

Figure 8:
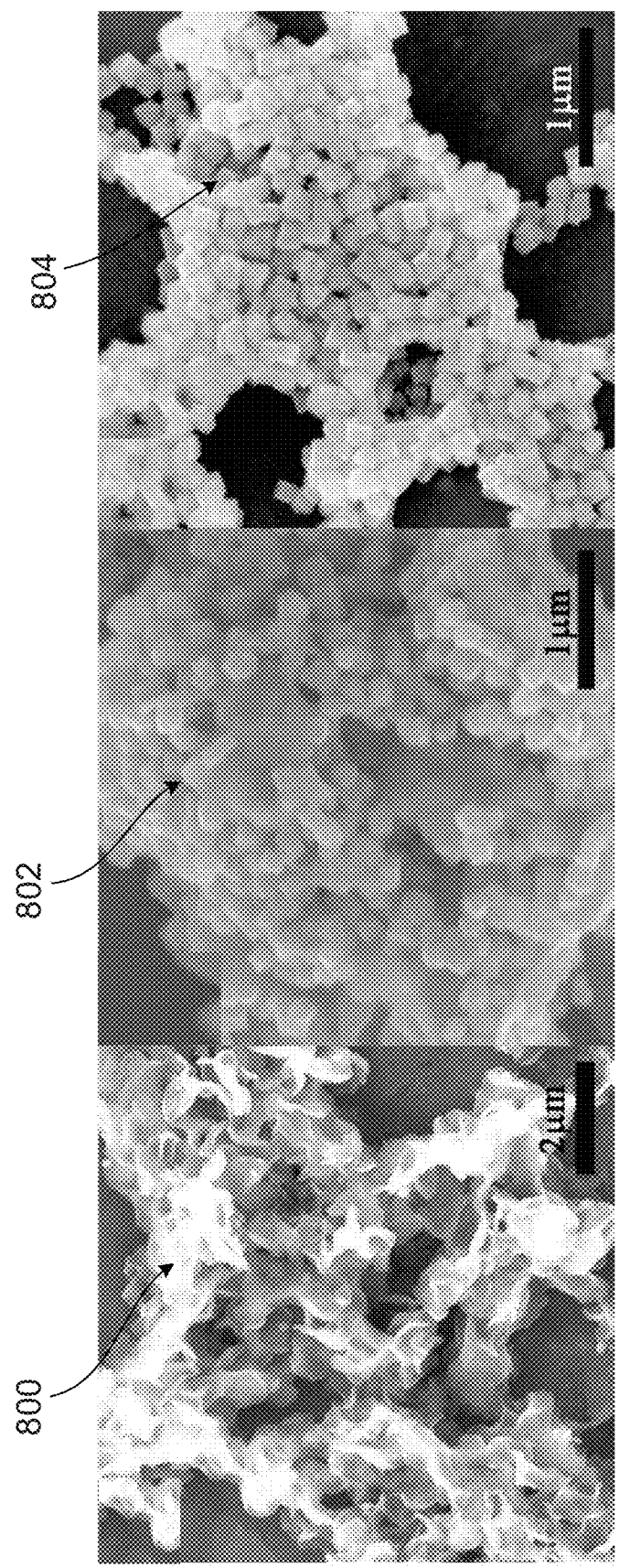
FIGS. 8A-8C are SEM images of films of iron pyrite nanocrystals yielded from reactions with various reaction times.

FIGS. 8A, 8B, and 8C are SEM images of the reaction product at 2 minutes, 4 minutes, and 6 minutes, respectively, after sulfur injection. The transformation of the reaction product from a substantially amorphous matrix 800 (FIG. 8A) to a more structured product 802 (FIG. 8B) and finally to cubic nanocrystals 804 (FIG. 8C) can be seen from the SEM images.

Figure 9:
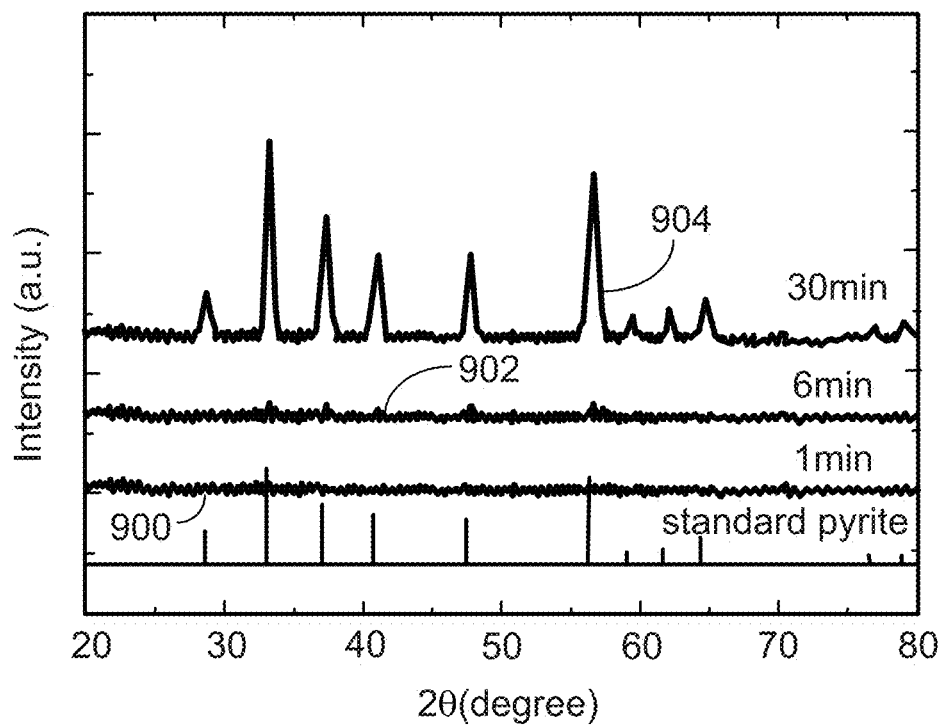
FIG. 9 is a plot of X-ray diffraction patterns of films of iron pyrite nanocrystals yielded from reactions without TOPO.
Figure 10:
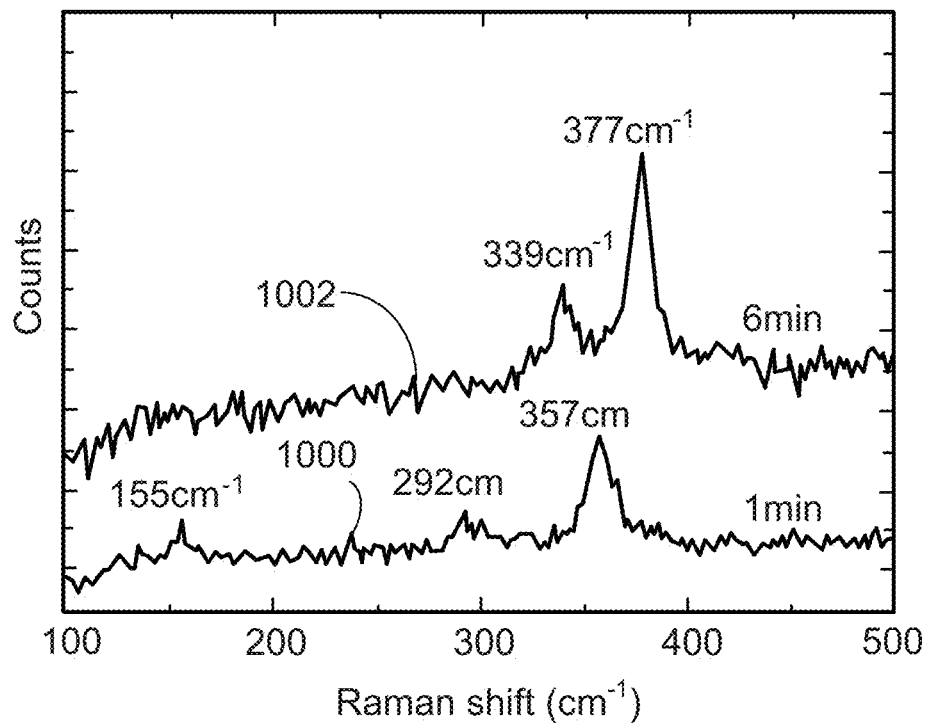
FIG. 10 is a plot of Raman spectra of films of iron pyrite nanocrystals yielded from reactions without TOPO.

Reaction products resulting from the synthesis of iron pyrite nanocrystals without the presence of TOPO were also characterized to monitor the evolution of the morphology and composition of the products. FIG. 9 shows X-ray diffraction patterns taken 1 minute, 6 minutes, and 30 minutes after sulfur injection into a reaction mixture without TOPO (patterns 900, 902, 904, respectively). FIG. 10 shows Raman spectra taken 1 minute and 6 minutes after sulfur injection (spectra 1000, 1002, respectively). An amorphous phase $Fe_{1-x}S$ formed by 1 minute after sulfur injection, as can be seen from the Raman peaks at 155 $cm^{-1}$, 292 $cm^{-1}$, and 365 $cm^{-1}$ in the spectrum 1000. By 6 minutes after sulfur injection, the amorphous intermediate had been transformed to iron pyrite $FeS_2$, as can be seen from the Raman peaks at 339 $cm^{-1}$ and 377 $cm^{-1}$ in the spectrum 1002. No obvious impurity phases can be seen in the 6-minute Raman spectrum 1002. From the X-ray diffraction patterns 900, 902, 904, it is apparent that the reaction product takes a longer time to reach a high level of crystallinity in the reaction without TOPO than it does in the reaction with TOPO. The iron pyrite phase is not strongly visible in the early diffraction patterns 900, 902; sharp iron pyrite diffraction peaks become visible only in the 30-minute diffraction pattern 904. Other than the slower development of crystallinity in the reaction product, no obvious difference in the reaction process or in the crystal structure of the resulting reaction product is observed between the reactions with and without TOPO.

Additional synthesis reactions were carried out to optimize reaction conditions for the synthesis of pure phase pyrite $FeS_2$ nanocrystals. For instance, reaction times to form the Fe precursor species prior to sulfur injection ranging from about 1 to 3 hours were used. With shorter reaction times for forming the Fe precursor species, the complete transformation from amorphous phase $Fe_{1-x}S$ to iron pyrite $FeS_2$ generally took a longer amount of time after sulfur injection. Higher concentrations of OLA resulted in broader nanocrystal size distributions and longer transformation times. When oleic acid was used in place of OLA, no nanocrystals were produced. When using 1-dodecanethiol rather than TOPO as the ligand component, FeS phase impurities were observed in the resulting nanocrystals.

2 Fabrication and Stability of Films of Iron Pyrite Nanocrystals

Figure 11:
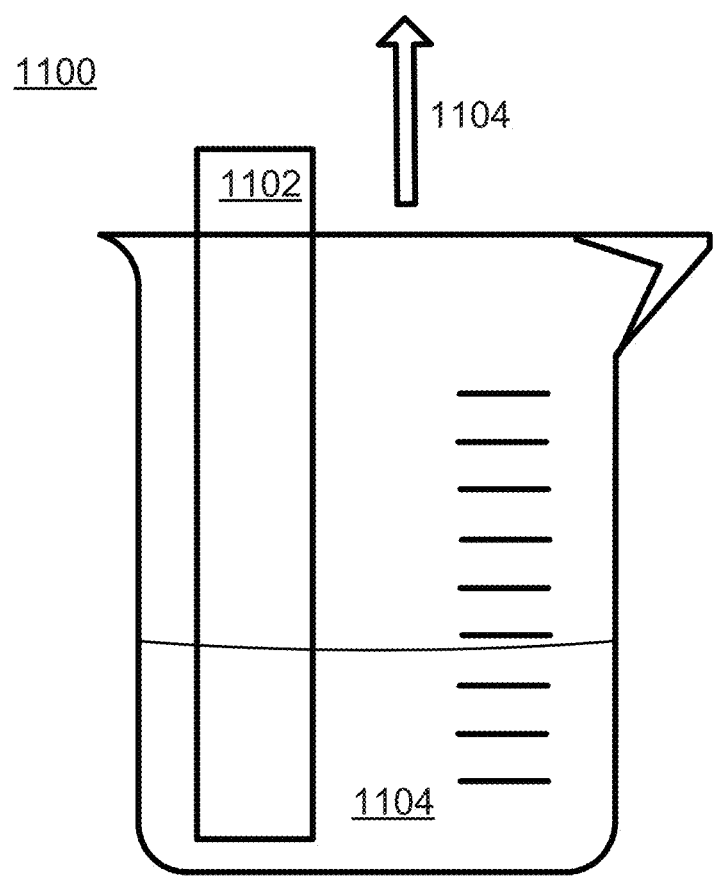
FIG. 11 is an example system for fabricating films of nanocrystals.
Figure 12C:
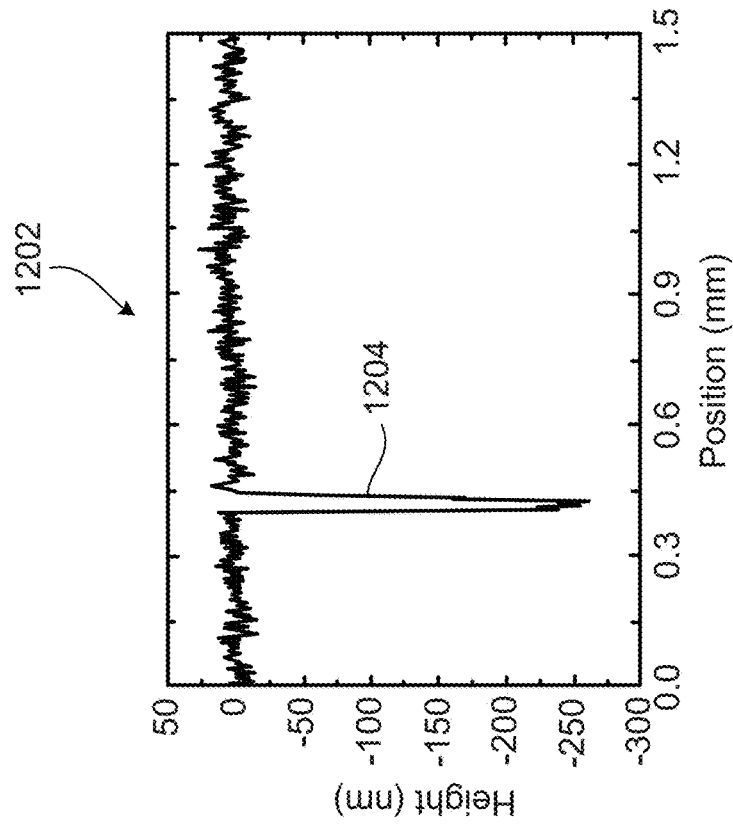
FIG. 12C is a plot of the surface profile of the film of FIGS. 12A and 12B.
Figure 12A:
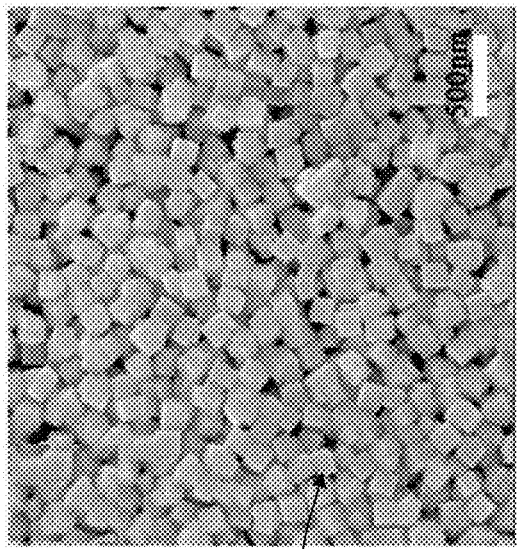
FIGS. 12A and 12B are SEM images of a film of iron pyrite nanocrystals.
Figure 12B:
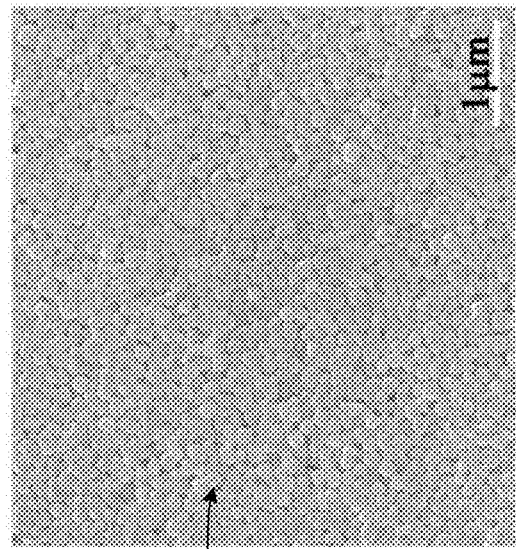

Films of nanocrystals on a substrate can be fabricated via any of a variety of methods, including, e.g., drop casting, spin coating, or dip coating. For instance, referring to FIG. 11, an example system 1100 for fabricating a dip coated film of nanocrystals on a substrate 1102 is shown. The substrate 1102 is dipped into a solution 1104 of nanocrystals and is withdrawn from the solution at a controlled speed and vertically along the direction in the plane of the substrate (as indicated by arrow 1106). The thickness of the resulting nanocrystal film can be controlled from a monolayer of nanocrystals to a thick film, such as 200 μm thick, or up to about 1 μm thick, by controlling the concentration of the nanocrystal solution and the speed of substrate withdrawal from the solution. In one example, a 300 nm thick nanocrystal film was formed using a 15 mg/mL solution of iron pyrite nanocrystals in chloroform with a withdrawal speed of 4 μm/s FIGS. 12A and 12B are SEM images of sample formed of a dip coated film 1200 of 60 nm TOPO-stabilized iron pyrite nanocrystals on a substrate. The nanocrystals are cubic and have good size uniformity. The film 1200 is relatively smooth, as can be seen from a surface profile 1202 in FIG. 12C, with a surface roughness of about ±25 nm. A scratch 1204 in the sample was made to provide a sense of scale in the surface profile 1202. For a film of about 0.4 μm thick, which is a thickness that is generally capable of efficiently absorbing solar radiation, this order of surface roughness is within appropriate tolerance levels. SEM was performed on a Quanta 200 FEG SEM at high vacuum mode to record the size and morphology of the nanocrystals. Film thickness and surface roughness were measured using an Ambios technology XP stylus profiler.

In general, the surface of iron pyrite is thermodynamically unstable. Surface $FeS_2$ units are susceptible to oxidation and can easily decompose, resulting in surface layers formed of metallic FeS and elemental sulfur. The large surface-to-volume ratio of nanocrystals accelerates the oxidation process. The oxidation of the surface of iron pyrite nanocrystals into FeS and sulfur layers causes the semiconducting properties of the nanocrystals to be lost, rendering the nanocrystals less attractive for photovoltaic applications.

By coating iron pyrite nanocrystals with ligands such as TOPO (e.g., using the synthesis process described above), the oxidation of the nanocrystal surface can be hindered or prevented. Films of TOPO-stabilized iron pyrite nanocrystals are stable in air for at least one year and retain their semiconducting properties. Without being bound by theory, it is believed that the presence of the ligand (e.g., TOPO) passivates the nanocrystal surface, thus preventing oxidation and surface decomposition.

Figure 13A:
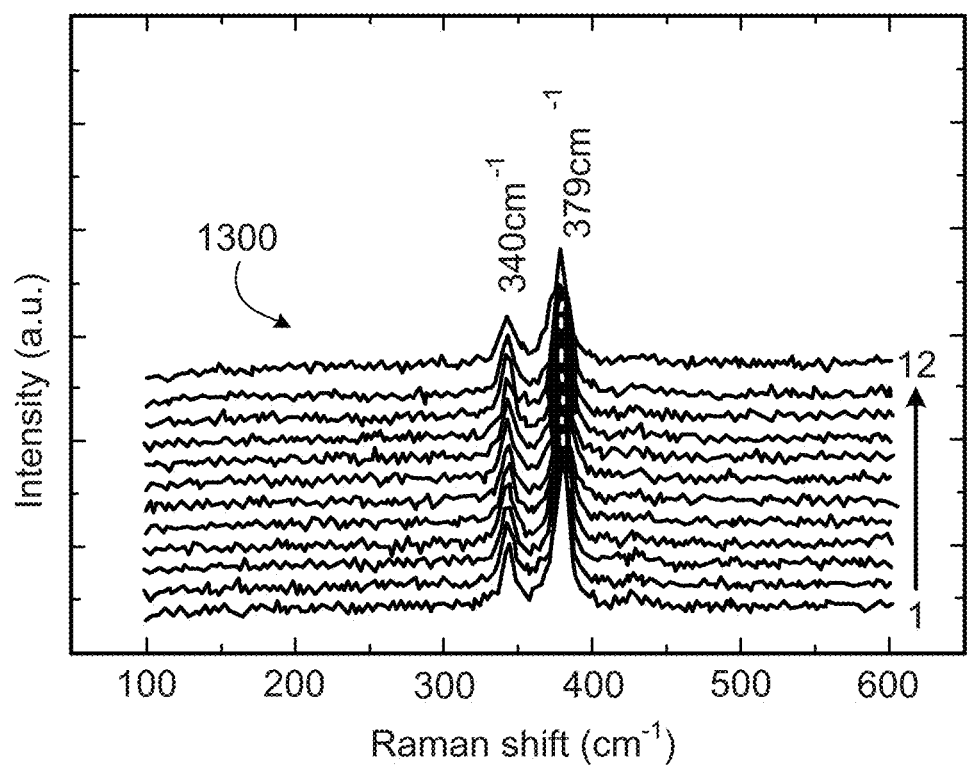
FIG. 13A is a plot of a Raman spectrum of a film of iron pyrite nanocrystals after exposure to air for one year.
Figure 13B:
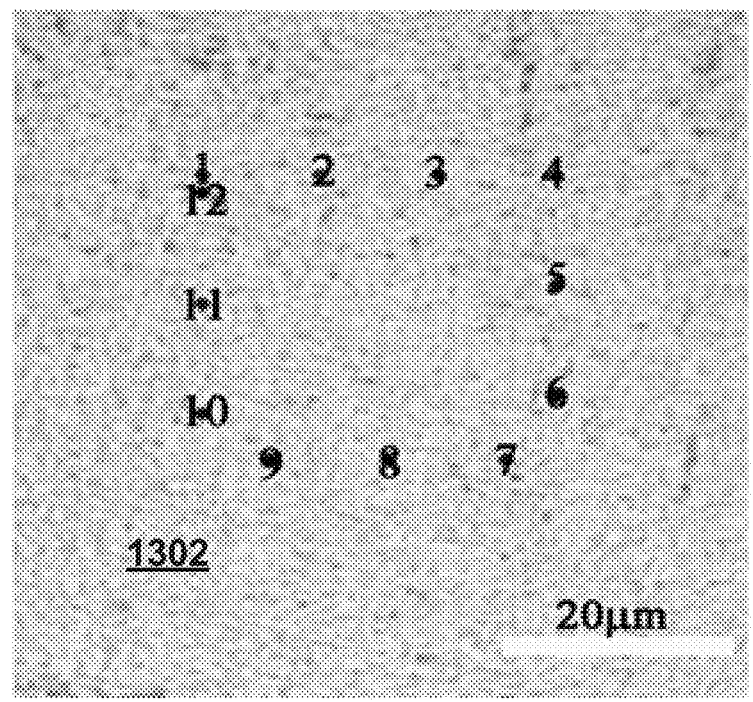
FIG. 13B is an optical microscopy image of the film of FIG. 13A.

A film of TOPO-stabilized iron pyrite nanocrystals was prepared and exposed to air for one year to characterize the stability and resistance to oxidation and degradation. FIG. 13A shows Raman spectra 1300 taken at randomly selected positions on the nanocrystal film after exposure to air for one year. The positions are designated by points in an optical microscopy mapping image 1302 of FIG. 13B. The Raman peaks at 340 $cm^{-1}$ and 379 $cm^{-1}$ indicate that iron pyrite $FeS_2$ is present in the film. No FeS or S peaks are present. Furthermore, when inspected visually, the film looked no different after aging for one year than it did when it was first formed. TOPO-stabilized iron pyrite nanocrystals are stable in air for at least one year; prolonged exposure to air does not cause oxidation or degradation of the nanocrystals.

Figure 14A:
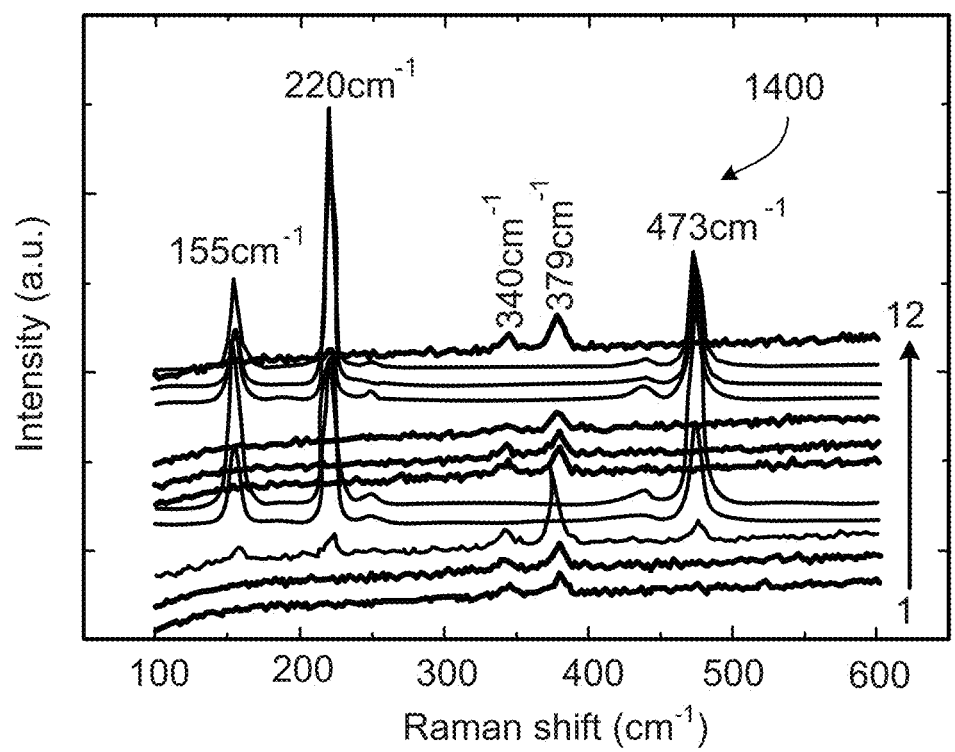
FIG. 14A is a plot of a Raman spectrum of a film of iron pyrite nanocrystals yielded from a reaction without TOPO, after exposure to air for three months.
Figure 14B:
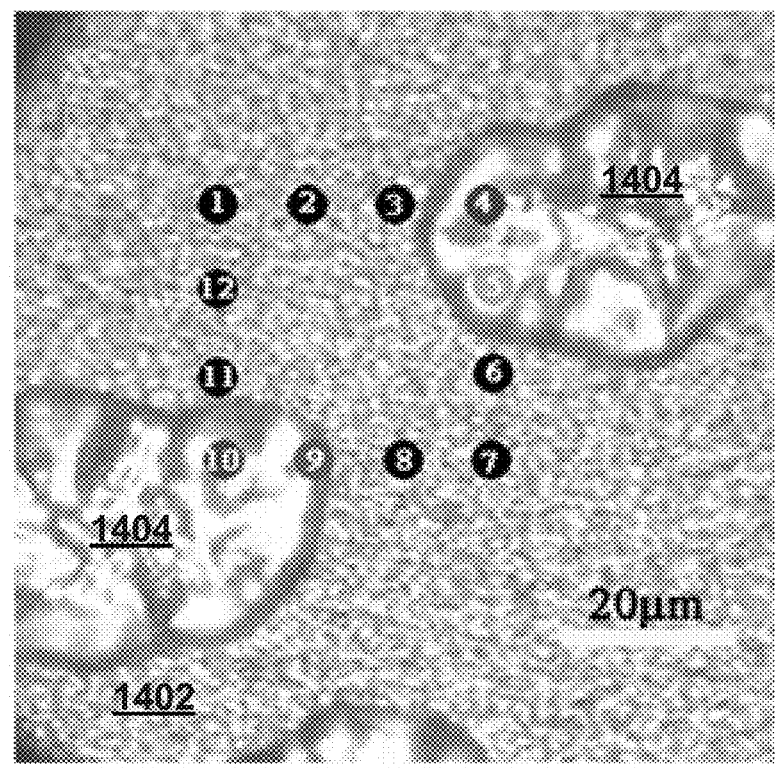
FIG. 14B is an optical microscopy image of the film of FIG. 14A.

As a control, a film of iron pyrite nanocrystals without TOPO was prepared under the same reaction conditions and exposed to air for three months. FIG. 14A shows Raman spectra 1400 taken at randomly selected positions on the nanocrystal film after exposure to air for three months. The positions are designated by points in an optical microscopy mapping image 1402 of FIG. 14B. Raman peaks at 155 $cm^{-1}$, 220 $cm^{-1}$, and 473 $cm^{-1}$ indicate the presence of FeS and S in the film. Visually, domains 1404 in the film suggest that sulfur has segregated at the surface of the film. The iron pyrite nanocrystals formed without TOPO are not stable in air and decompose into metallic FeS and S layers.

Figure 15:
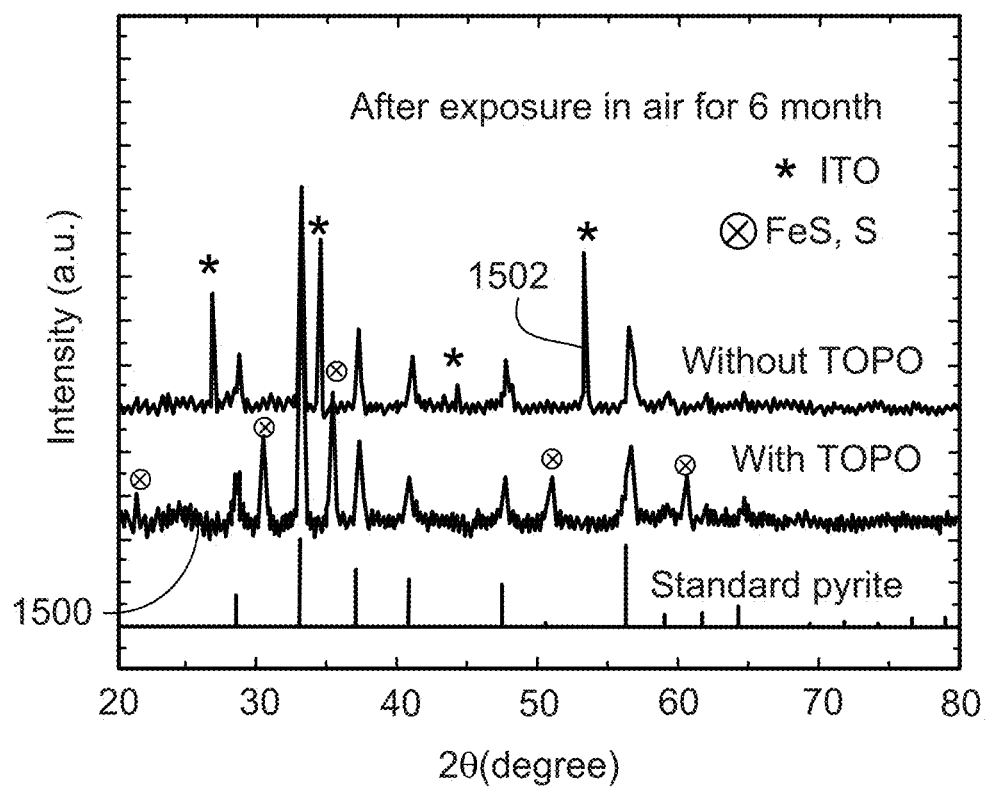
FIG. 15 is a plot of X-ray diffraction patterns of films of iron pyrite nanocrystals yielded from reactions with and without TOPO, after exposure to air for six months.

Films of iron pyrite nanocrystals yielded from reactions with and without TOPO were formed and exposed to air for six months. Referring to FIG. 15, X-ray diffraction patterns of the film of TOPO-stabilized nanocrystals (pattern 1500) and the film of nanocrystals without TOPO (pattern 1502)

were obtained to characterize any structural changes that occurred due to exposure to air. No obvious oxidation products were identified from the pattern 1500 for the film of TOPO-stabilized nanocrystals, indicating that these nanocrystals are structurally stable in air. In the pattern 1502 for the film of nanocrystals without TOPO, peaks corresponding to FeS and S are present, further indicating that the nanocrystals without TOPO are not stable in air.

The presence of photoconductivity in a film is a prerequisite for the film to be a candidate for photovoltaic applications. The purity of a material affects its photoconductive response. For instance, only high purity iron pyrite will exhibit photoconductivity; the presence of defects such as metallic FeS will quench excited photocarriers, reducing or eliminating the photoconductivity in defect-rich iron pyrite films. The stability of films of TOPO-stabilized iron pyrite nanocrystals and the purity and high degree of crystallinity of the nanocrystals themselves make these films good candidates for use in photovoltaic applications.

Figure 25:
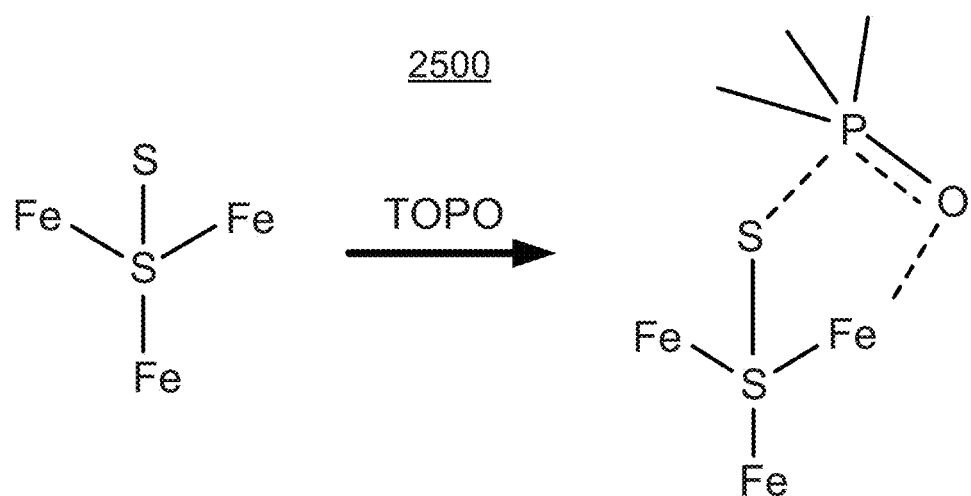
FIG. 25 is a scheme of a possible surface passivation mechanism.

From these Raman and X-ray diffraction characterizations, it is apparent that the stability of iron pyrite nanocrystals improves dramatically when stabilized with TOPO. Without being bound by theory, it is believed that TOPO may participate in a surface passivation mechanism 2500 such as that shown in FIG. 25. Generally, in a TOPO/OLA mixture, the TOPO will bind preferentially to Fe because the phosphine oxide in TOPO is a slightly stronger base than the amine in OLA. Phosphine oxide coordination to the nanocrystal surface occurs between an oxygen atom and a surface Fe atom and between a phosphorous atom and a surface S atom, due to attractive charge interactions. The coordination of TOPO to the surface of iron pyrite nanocrystals thus passivates both Fe and S surface sites, forming stable surface structures that inhibit the segregation of sulfur dimers on the nanocrystal surface.

For pyrite nanocrystals synthesized without TOPO, the only coordinating solvent is OLA, which coordinates to iron on the nanocrystal surface through its nitrogen atom. Only the Fe surface sites are passivated, leaving dangling bonds from the S surface sites available to react with oxygen in the air. Thus, pyrite nanocrystals not stabilized with TOPO are not stable in air, resulting in sulfur segregation (e.g., into the domains 1404 shown in FIG. 14B).

Although the examples given herein characterize TOPO-stabilized iron pyrite nanocrystals, other ligands are also capable of coordinating to both Fe and S sites, thus passivating the nanocrystal surface and stabilizing the surface against oxidation. For instance, other ligands that include a phosphine oxide group may be used. Example ligands include, but are not limited to, triphenylphosphine oxide or phospholipids such as L-α-Phosphatidylcholine, 1,2-bis(10, 12-tricosadiynoyl)-sn-Glycero-3-phosphocholine, or 1,2-Dipropionoyl-sn-Glycero-3-Phosphocholine. Other ligands capable of coordinating to both Fe and S sites may also be used. Ligands that coordinate to only Fe sites or only S sites may not sufficiently passivate the surface.

3 Optoelectronic Properties of Iron Pyrite Nanocrystals

The purity, crystallinity, and surface stability of iron pyrite nanocrystals render the nanocrystals suitable for photovoltaic applications. The band gap and photoresponse of the nanocrystals, which are other parameters relevant to the use of the nanocrystals in photovoltaic applications were characterized by optical and electric characterization techniques.

Figure 16:
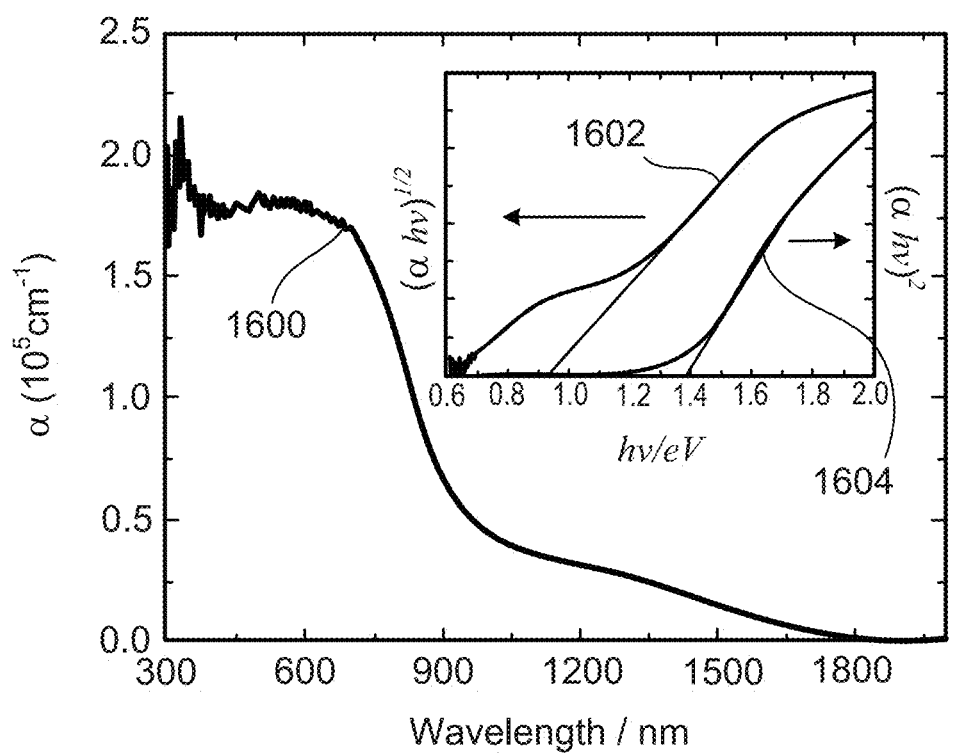
FIG. 16 is a plot of an optical absorption spectrum of iron pyrite nanocrystals.

Referring to FIG. 16, optical absorption spectra of films of TOPO-stabilized iron pyrite $FeS_2$ nanocrystals were obtained to characterize the optical properties and band gap of the nanocrystals. An optical absorption spectrum 1600 shows the absorption coefficient, $\alpha$, versus the illumination wavelength. The film of nanocrystals has a high absorption efficiency ($\alpha \approx 2\times10^5$ $cm^{-1}$) throughout the visible and near infrared spectral regions, demonstrating that the film is a good solar absorber. Optical spectra of dip coated films of TOPO-stabilized iron pyrite nanocrystals were obtained at room temperature for wavelengths between 300 nm and 2000 nm using a PerkinElmer (Waltham, Mass.) Lambda 900 UV/VIS/NIR spectrometer.

The purity, crystallinity, and stability of the iron pyrite nanocrystals described herein enables the band gap of the nanocrystals to be determined. In the inset of FIG. 16, the quantity $(\alpha h\nu)^n$ was plotted versus the illumination energy ($h\nu$), where h is Planck's constant and $\nu$ is the illumination frequency, for $n=\frac{1}{2}$ (curve 1602) and $n=1$ (curve 1604). The indirect and direct optical band gaps of the film of nanocrystals were determined based on linear extrapolation of the curves 1602, 1604 to their intersection with the x-axis of the plot to be 0.93 eV (indirect) and 1.38 eV (direct). In some cases, light absorption below the band gap can be induced by light scattering during the measurement, giving rise to shoulders on the low-energy end of the curves 1602, 1604, respectively.

Electric properties of films of TOPO-stabilized iron pyrite nanocrystals were characterized to evaluate the suitability of the films for photovoltaic applications. For instance, the product of the mobility ($\mu$) and carrier lifetime ($\tau$) is an important parameter for evaluating the candidacy of a photovoltaic material because it determines the carrier diffusion length, i.e., the maximum thickness of the active film. A large $\mu\tau$ is generally preferable so that a relatively thick film can be used to efficiently absorb solar illumination. Hall Effect mobility of dip coated films of TOPO-stabilized iron pyrite nanocrystals was determined to be about 80 $cm^2/Vs$, with p-type behavior. This value is high compared to other solution-processed electronic materials, such as organic semiconductors and metal oxide semiconductors.

Figure 17:
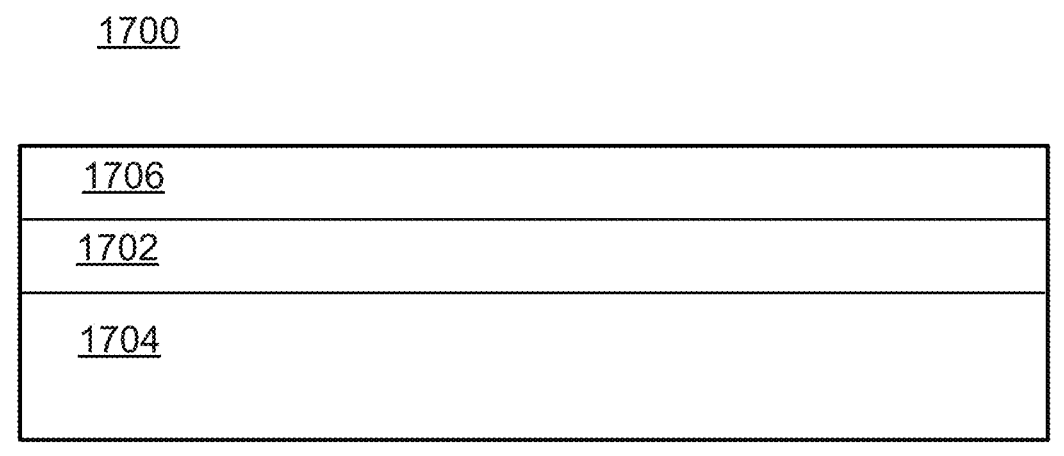

The photoresponse of films of TOPO-stabilized iron pyrite nanocrystals was also characterized. FIG. 17 is an example of an nanocrystal-based photovoltaic device 1700. A photovoltaic film 1702 of iron pyrite nanocrystals was formed on a transparent, electrically conductive substrate 1704, such as indium tin oxide (ITO). An electrical contact 1706, formed of aluminum or another electrically conductive material, was disposed on the nanocrystal film 1702, e.g., by lithographic methods. Illumination light 1708 from a light source 1710, such as a lamp or the sun, was impinged onto the substrate 1704 and absorbed by the photovoltaic film 1702. The illumination generates a photocurrent in the film 1702 between the substrate 1704 and the electrical contact 1706.

The carrier lifetime in the nanocrystal-based photovoltaic device 1700 was measured using a photoconductive response measurement that reflects the density of defect states in the iron pyrite material. Current-voltage (I-V) measurements were conducted on the nanocrystal-based photovoltaic device 1700 for a nanocrystal film 1702 with a thickness of 400 nm on an ITO substrate 1704 and with an Al contact 1706. Simulated sunlight of air mass (AM) 1.5 (100 $mW/cm^2$) was applied to the device 1700 and the photoresponse was measured using a Keithley (Cleveland, Ohio) 2400 source meter.

Figure 18A:
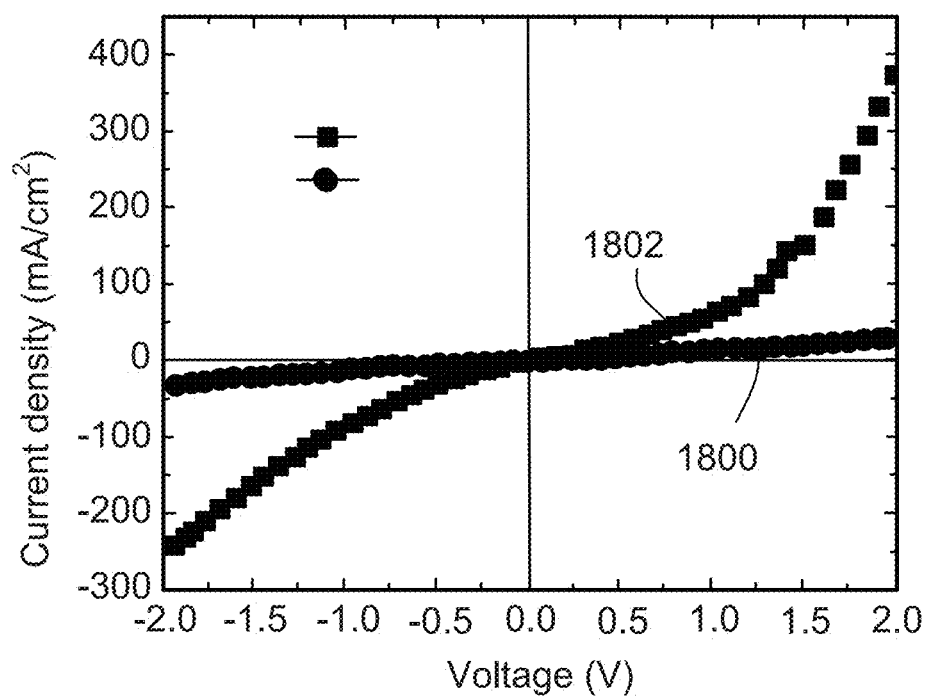
FIGS. 18A and 18B are plots of the photoresponse of a photovoltaic device including a film of iron pyrite nanocrystals.
Figure 18B:
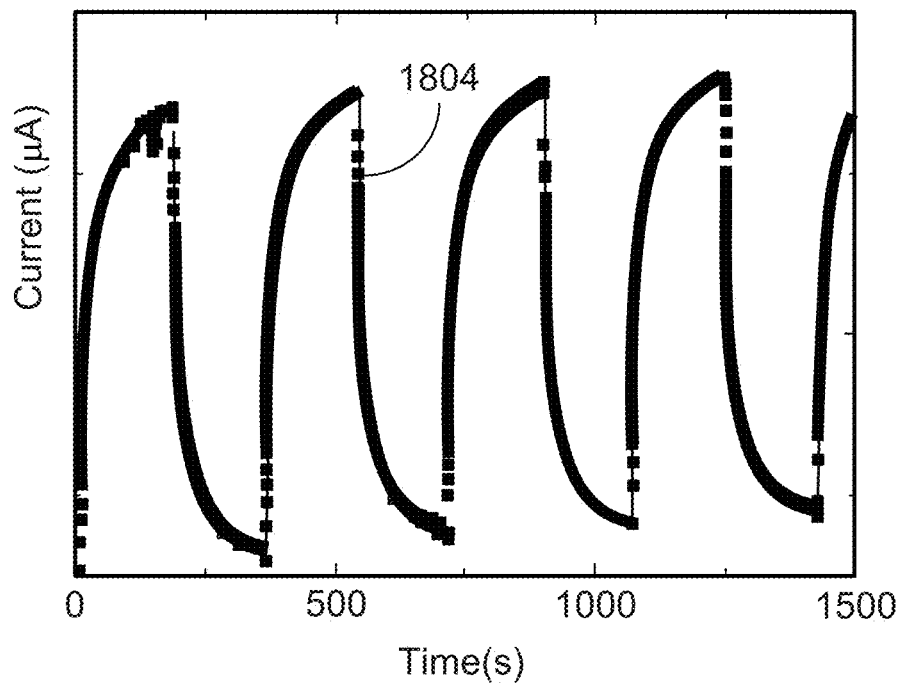

FIGS. 18A and 18B show the results of photocurrent measurements of the nanocrystal-based photovoltaic device 1700 with a 400 nm thick photovoltaic film 1702. The response under dark conditions is shown by a dark I-V curve 1800; the response under AM 1.5 illumination is shown by a light I-V curve 1802. The variation of photocurrent with time as the illumination is switched on and off is shown by a time-varying current curve 1804. With no illumination, minimal response is observed (curve 1800). When illuminated, a 12-fold increase in current occurs (curves 1802, 1804), demonstrating that the film of TOPO-stabilized nanocrystals acts as a photoconductor. No rectification behavior is observed, suggesting that no Schottky barrier is formed between the nanocrystal film 1702 and either the Al contact 1706 or the ITO substrate 1702. The strong, stable photoconductivity of the photovoltaic device 1700 indicates that films of TOPO-stabilized iron pyrite nanocrystals may be used to form efficient solar cells.

Films with large crystalline grain size (e.g., films of large nanocrystals) are often used in photovoltaic applications such that the carrier diffusion length is matched with the light absorption length. In contrast, films with small grain size (e.g., films of small nanocrystals) can be small and compact but often contain a large number of grain boundaries that scatter carriers, reducing the carrier diffusion length. Because the quantum confinement effect is not needed for band gap control in films of iron pyrite nanocrystals, films of relatively large nanocrystals (e.g., about 200 nm) were used such that the desired film thickness for photovoltaic applications was achieved.

4 Zinc-Doped Iron Pyrite Nanocrystals

The TOPO-stabilized iron pyrite nanocrystals described above can be doped with dopants, such as other transition metals, to adjust the band gap of the nanocrystals. For instance, the nanocrystals may be doped with Zn to form $Fe_{1-x}Zn_xS_2$ alloyed nanocrystals.

The synthesis of $Fe_{1-x}Zn_xS_2$ nanocrystals is generally consistent the synthesis described above for iron pyrite nanocrystals, except for the introduction of zinc and an increase in the injection temperature. For example, to synthesize $Fe_{0.9}Zn_{0.1}S_2$ nanocrystals, 0.9 mmol anhydrous Iron (II) chloride ($FeCl_2$ (99.9%), (Sigma-Aldrich)), 0.1 mmol zinc acetate ($Zn(OAc)_2$ (97%), Sigma-Aldrich), 0.6 mmol TOPO (Sigma-Aldrich), and 20 mL OLA were degassed at 120° C. under vacuum for one hour to remove oxygen and water. The solution was further refluxed at 170° C. for two hours under nitrogen to form an Fe—OLA precursor complex. The solution temperature was then increased to 220° C. and 10 mL of a solution of 0.6 M sulfur in OLA was injected. The reaction was kept at 220° C. for two hours to facilitate growth of Zn-doped iron pyrite nanocrystals. The reaction was then quenched by removing the heat source and the reaction mixture was cooled to room temperature. The as-prepared nanocrystals were precipitated from the reaction mixture by the addition of excess isopropanol (IPA, Sigma-Aldrich) and isolated by centrifugation. The nanocrystals were washed with mixtures of toluene/IPA, toluene/IPA, and chloroform/methanol and redispersed in chloroform for storage.

Other doping levels, such as $FeS_2$, $Fe_{0.95}Zn_{0.05}S_2$, $Fe_{0.8}Zn_{0.2}S_2$, $Fe_{0.7}Zn_{0.3}S_2$, and $Fe_{0.5}Zn_{0.5}S_2$, can be synthesized according to a similar synthesis process by appropriately adjusting the quantities of iron chloride and zinc acetate in the reaction.

Figure 19:
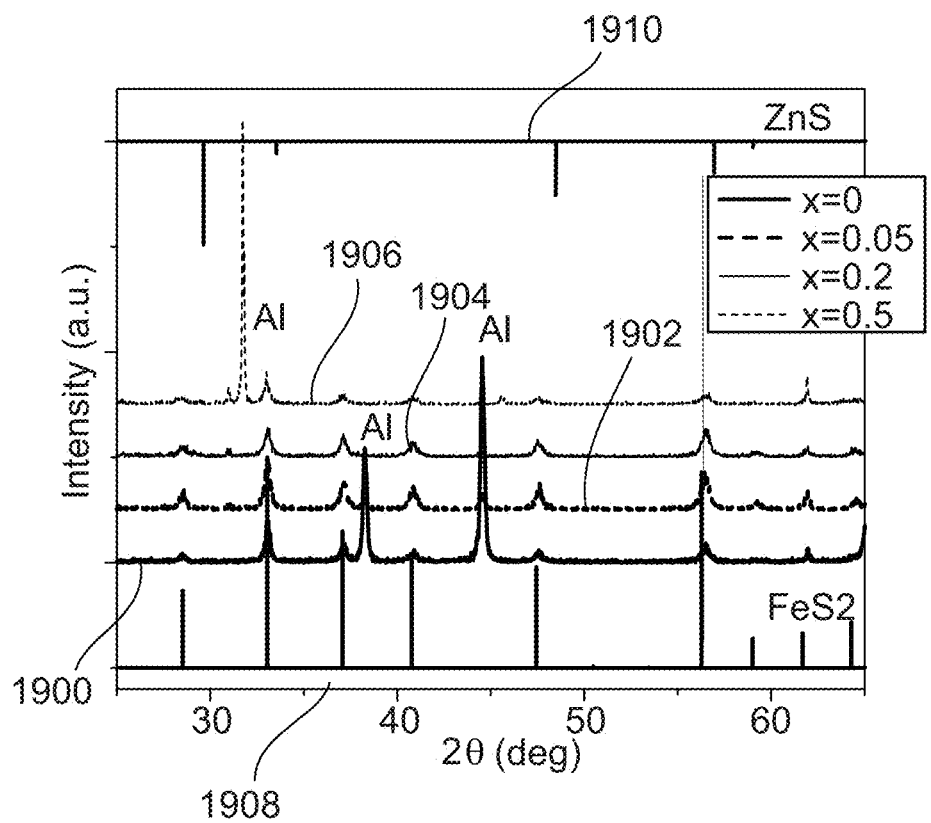
FIG. 19 is a plot of X-ray diffraction patterns of films of Zn-doped iron pyrite nanocrystals.

Referring to FIG. 19, the crystal structure of TOPO-stabilized $Fe_{1-x}Zn_xS_2$ nanocrystals was characterized using powder X-ray diffraction on drop cast films of nanocrystals on a Si wafer substrate. Various compositions were studied, including x=0 (i.e., iron pyrite $FeS_2$ nanocrystals; curve 1900), x=0.05 (curve 1902), x=0.2 (curve 1904), and x=0.5 (curve 1906). Sharp diffraction peaks are present in good agreement with the cubic pyrite phase of $FeS_2$ (JCPDS no. 42-130; reference curve 1908). No obvious impurity peaks are present in the diffraction patterns. Other strong peaks in the diffraction patterns are a result of the Al substrate holder.

As the amount of Zn increases (i.e., as x increases), the iron pyrite diffraction peaks widen and shift slightly. This change in the diffraction pattern is due to the incorporation of Zn into the iron pyrite crystal structure, which results in an increase in the lattice constant. For comparison, a reference diffraction pattern 1910 for cubic ZnS (JCPDS no. 80-0020) is shown. The peak shift caused by increased Zn doping is not large enough to indicate formation of a ZnS phase in the nanocrystals, thus suggesting that the $Fe_xZn_{1-x}S_2$ nanocrystals retain the cubic iron pyrite crystal structure at least up to a Fe:Zn ratio of 1:1 (x=0.5).

Figure 20:
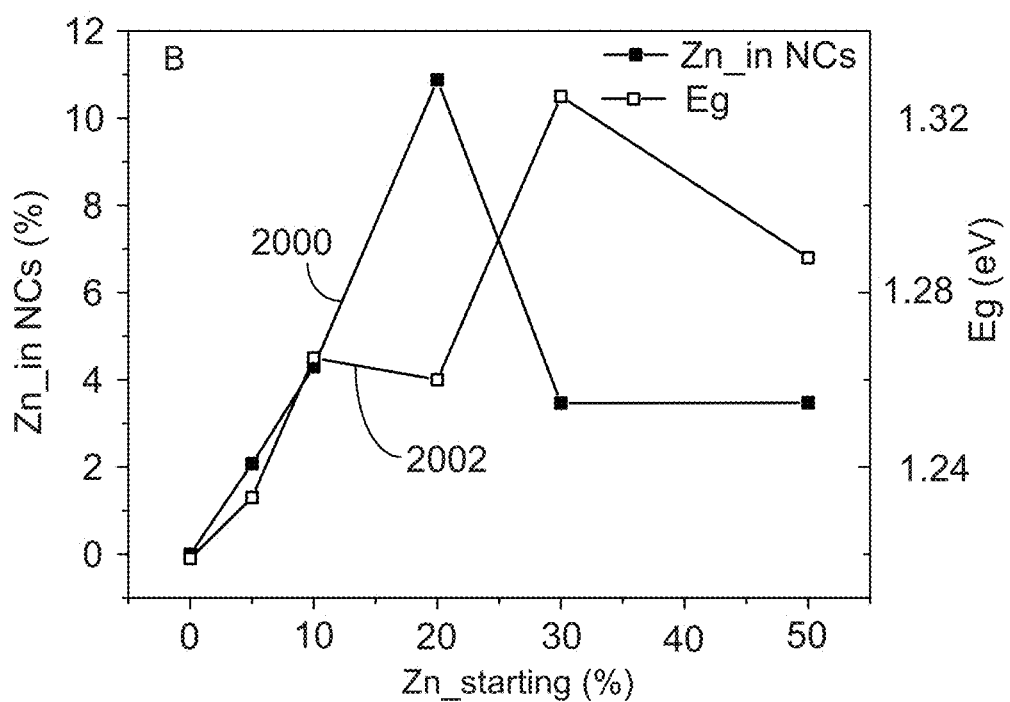
FIG. 20 is a plot of the composition and band gap of films of Zn-doped iron pyrite nanocrystals.

Referring to FIG. 20, the actual composition of the TOPO-stabilized $Fe_{1-x}Zn_xS_2$ nanocrystals was measured for various starting values of x (i.e., for various Fe:Zn ratios used in the synthesis reaction) using Inductively Coupled Plasma Atomic Emission Spectroscopy (ICP-AES). A curve 2000 represents the actual percentage of Zn in the nanocrystals versus the starting percentage of Zn in the synthesis reaction. For low doping levels (x<0.2), the actual Zn percentage in the nanocrystals is proportional to and roughly half of the starting Zn percentage. At higher doping levels (0.3<x<0.5), the level of Zn in the nanocrystals did not increase despite the increased quantity of Zn in the synthesis reaction.

Figure 21:
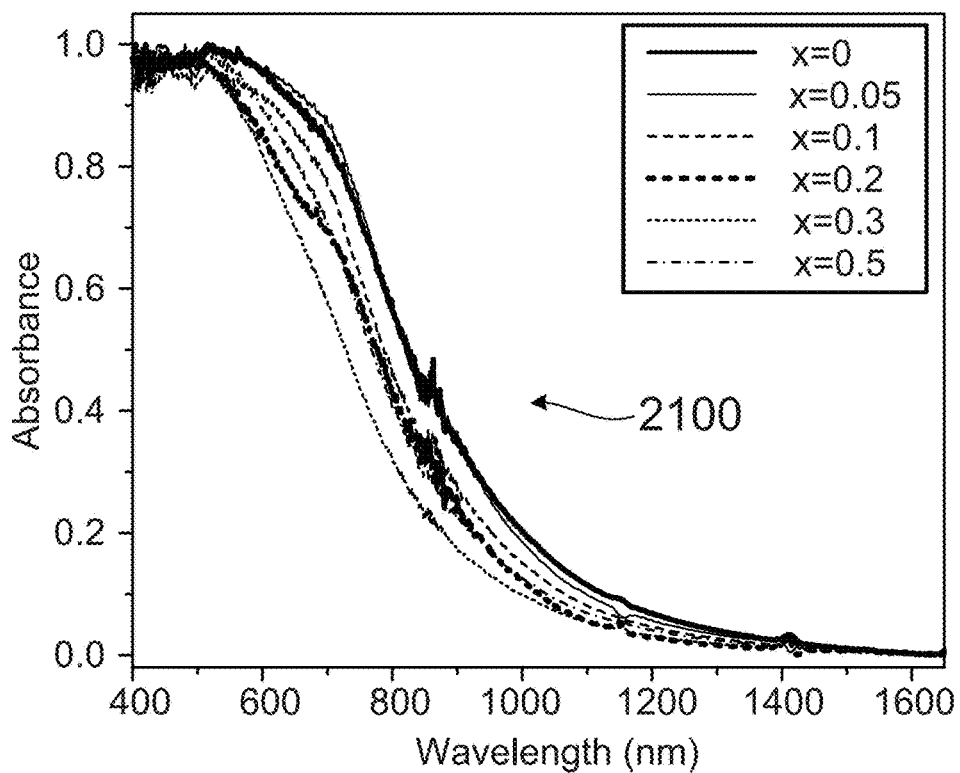
FIG. 21 is a plot of absorption spectra of films of Zn-doped iron pyrite nanocrystals.

Referring to FIG. 21, optical absorption spectra 2100 of TOPO-stabilized $Fe_{1-x}Zn_xS_2$ nanocrystals were obtained for x=0, x=0.05, x=0.1, x=0.2, x=0.3, and x=0.5. A blue shift of increasing magnitude occurs in the absorption spectra with increasing Zn doping, indicating that doping of iron pyrite nanocrystals (e.g., with Zn) can be used for band gap engineering of the nanocrystals.

Figure 22:
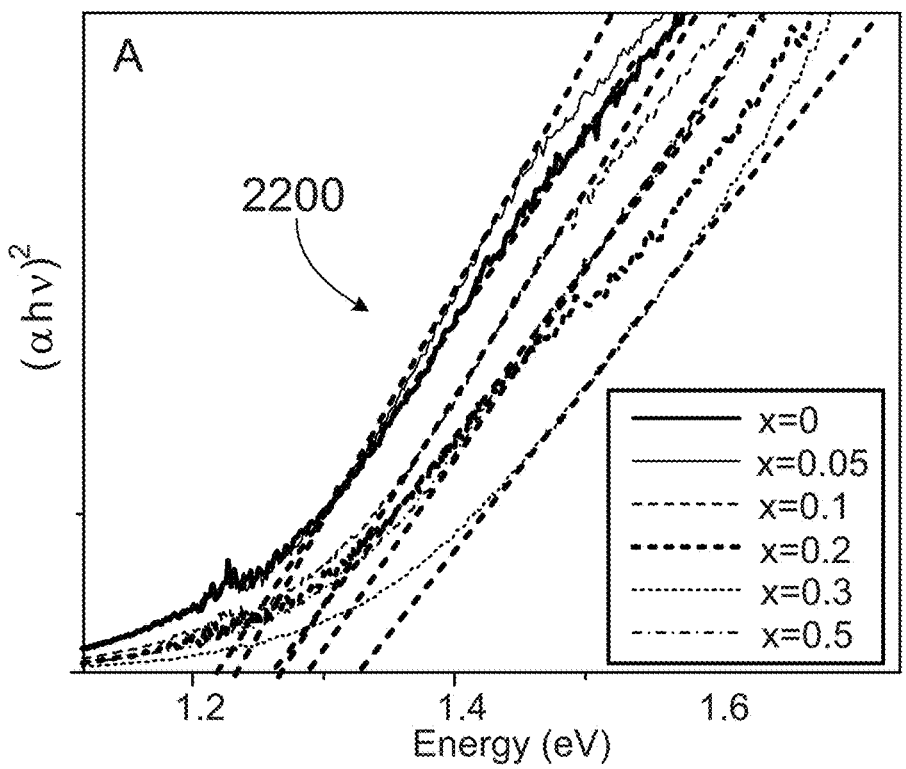
FIG. 22 is a plot of the band gap of films of Zn-doped iron pyrite nanocrystals.

The band gap of TOPO-stabilized $Fe_{1-x}Zn_xS_2$ nanocrystals can be determined from an absorption curve plot of the quantity $(\alpha h\nu)^2$ versus the illumination energy (hν), where h is Planck's constant and ν is the illumination frequency. These absorption curves 2200 are shown in FIG. 22 for x=0, x=0.05, x=0.1, x=0.2, x=0.3, and x=0.5. The band gap for each composition as determined from the curves of FIG. 22 is shown as a curve 2002 in FIG. 20. For low doping levels (x<0.1), the band gap of the $Fe_{1-x}Zn_xS_2$ nanocrystals increases roughly linearly with increasing Zn percentage. The band gap further increases to a maximum of about 1.325 eV for x=0.2 and then decreases to about 1.288 eV for x=0.3 and x=0.5. These results indicate that Zn doping of iron pyrite nanocrystals can be used to tune the band gap of the nanocrystals, although the relationship between the exact composition of the nanocrystals and the band gap shift is complex.

The integration of Zn into iron pyrite $FeS_2$ preserves the high crystallinity crystal structure of undoped $FeS_2$ nanocrystals and provides a mechanism to tune the band gap of the nanocrystals. As such, Zn-doped iron pyrite nanocrystals may be valuable in fabricating photovoltaic devices with specific target photovoltaic properties.

Iron pyrite $FeS_2$ nanocrystals can similarly be doped with other elements, such as other transition metals.

5 Solar Cells with Iron Pyrite Nanocrystals

Figure 23:
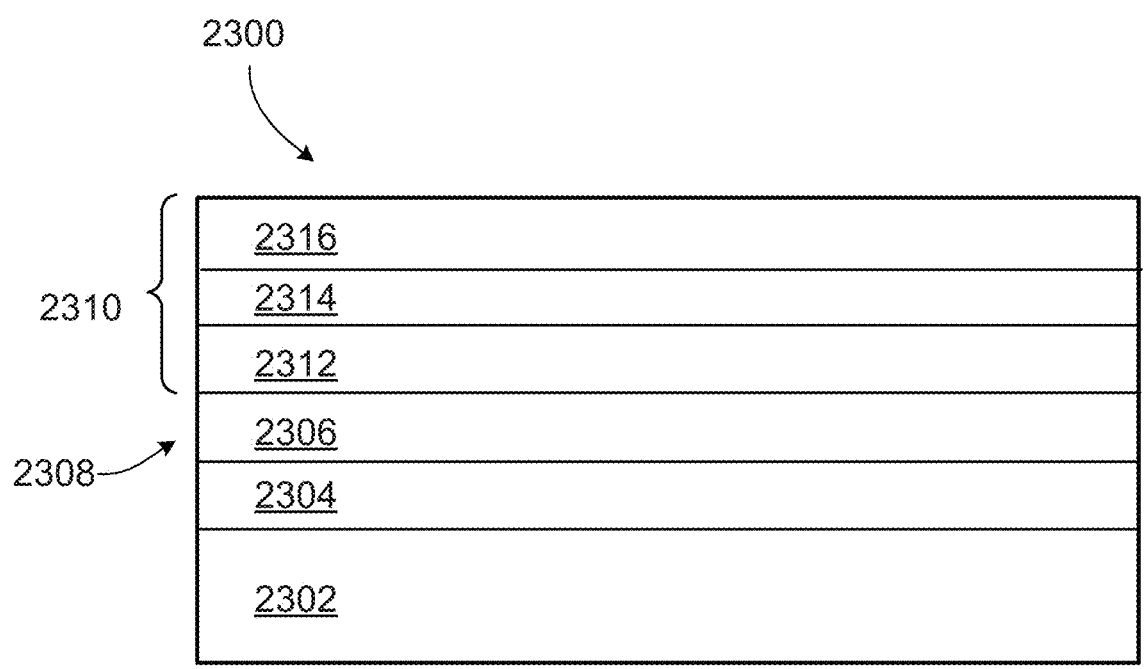
FIG. 23 is a diagram of an example solar cell.

An example solar cell 2300 is shown in FIG. 23. The solar cell 2300 includes a transparent, electrically conductive substrate 2302, such as ITO. An n-type layer 2304 formed of metal oxide or metal sulfide nanocrystals is formed on the substrate 2302. The metal oxide or metal sulfide nanocrystals may be, e.g., zinc oxide (ZnO), titanium dioxide ($TiO_2$), tin sulfide ($SnS_2$), tin dioxide ($SnO_2$), cadmium sulfide (CdS), or other metal oxide or metal sulfide materials. An active p-type photovoltaic layer 2306 of $Fe_{1-x}Zn_xS_2$ NCs is formed on the n-type layer 2304, forming a p-n junction 2308. An upper contact 2310 formed on the photovoltaic layer 2306 includes a layer 2312 of $MoO_3$, a layer 2314 of gold, and a layer 2316 of silver.

To fabricate the solar cell 2300, the substrate was cleaned and treated by ultraviolet-ozone for ten minutes. The n-type layer 2304 of metal oxide nanocrystals was spin coated onto the substrate. For example, a layer of ZnO nanocrystals was formed by spin coating a 5 mg/mL solution of ZnO nanocrystals in chloroform at 3000 rpm for 50 seconds, followed by annealing at 200° C. for ten minutes in air. The active photovoltaic layer 2306 of $Fe_{1-x}Zn_xS_2$ nanocrystals was formed by spin coating onto the n-type layer 2304, for example, by spin coating a 1.5 mg/mL solution of $Fe_{1-x}Zn_xS_2$ nanocrystals in chloroform at 2500 rpm for 30 seconds. The photovoltaic layer 2306 was then treated with a cross-linking molecule to form a high quality thin film. For instance, the photovoltaic layer 2306 was treated with a 1% ethanedithiol (EDT) solution in acetonitrile for 15 seconds, spun dry at 2500 rpm, and washed with acetonitrile, allowing ligand exchange onto the nanocrystals by the short chain EDT molecules. The contact 2310 was formed by thermal evaporation under vacuum of the layer 2312 of $MoO_3$ (e.g., 10 nm thick), the layer 2314 of Au (e.g., 20 nm thick), and the layer 2316 of Ag (e.g., 80 nm thick). The final active device area was approximately 0.075 $cm^2$. In some examples, iron pyrite $FeS_2$ nanocrystals (i.e., x=0) were used in the active photovoltaic layer 2306.

Figure 24A:
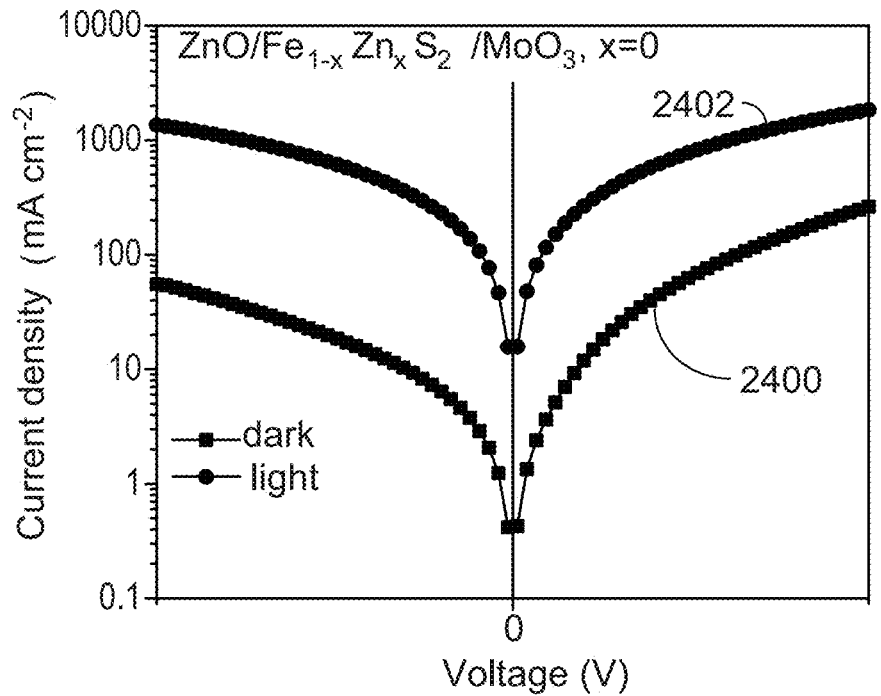
FIGS. 24A-24C are plots of the photoresponse of a solar cell including a film of Zn-doped iron pyrite nanocrystals.
Figure 24B:
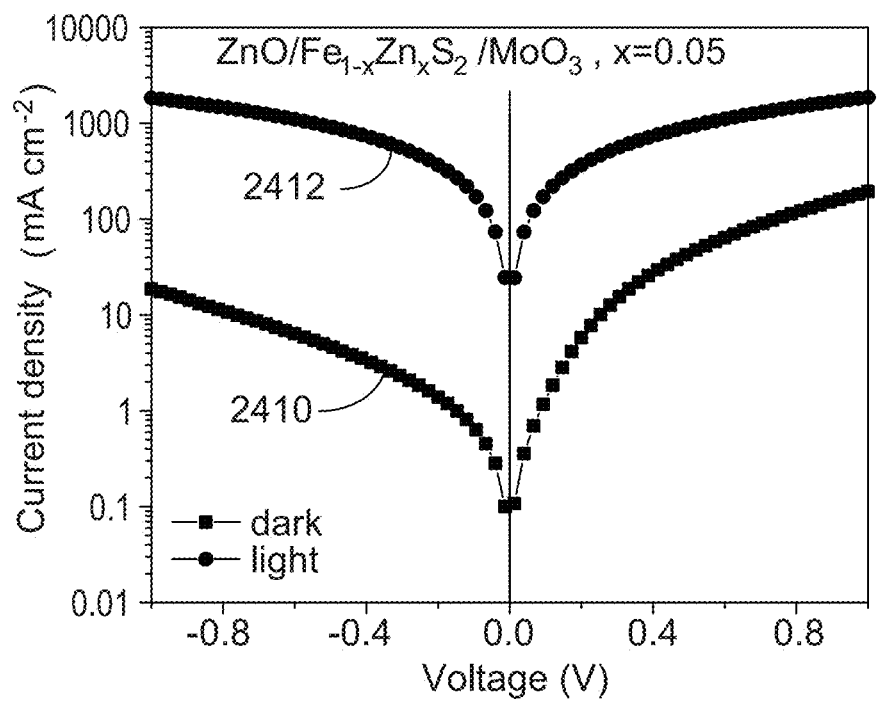
Figure 24C:
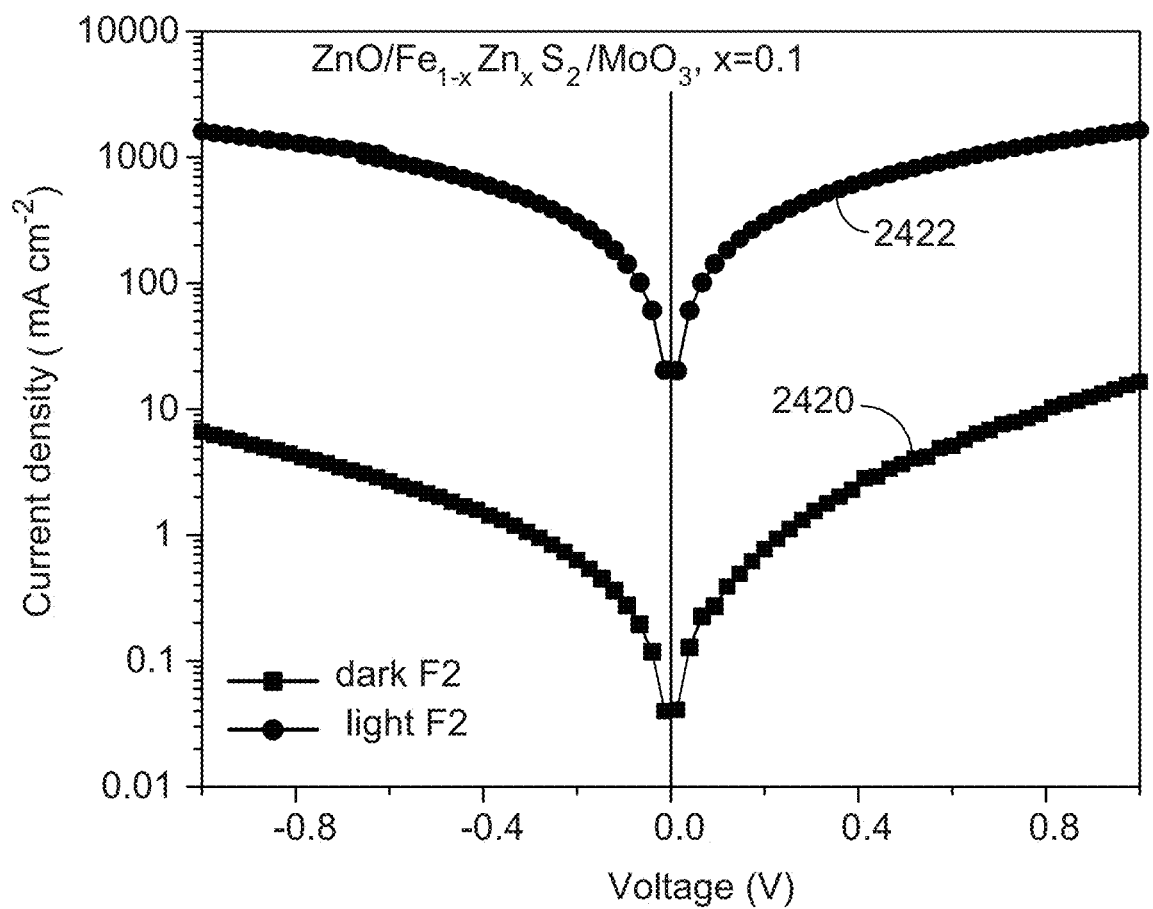

Solar cells 2300 were fabricated with $Fe_{1-x}Zn_xS_2$ nanocrystals for x=0 (i.e., iron pyrite $FeS_2$), x=0.05, and x=0.1. The photoresponse of each device was measured under dark conditions and under AM 1.5 illumination (simulated sunlight). FIG. 24A shows the photoresponse of the x=0 device (i.e., iron pyrite $FeS_2$ nanocrystals) under dark (curve 2400) and under illumination (curve 2402); FIG. 24B shows the photoresponse of the x=0.05 device under dark (curve 2410) and under illumination (curve 2412); FIG. 24C shows the photoresponse of the x=0.1 curve under dark (curve 2420) and under illumination (curve 2422).

The photovoltaic devices showed good photoresponse with high photocurrent but no photovoltage. The dark current decreases with increasing levels of Zn doping. For instance, at a bias of −1 V, the dark current decreases from 50 mA/$cm^2$ at x=0 to 18 ma/$cm^2$ at x=0.05, and to only 6 mA/$cm^2$ at x=0.1. The photocurrent remains roughly unchanged with Zn doping. Thus, increased Zn doping resulted in a dramatic increase in the on/off ratio of the photovoltaic devices.

A limiting factor to high efficiency iron pyrite solar cells is generally the high dark current, which leads to small open circuit voltages. The dark current is generally caused by phase impurities in the iron pyrite and by surface trap states in iron pyrite nanocrystals. The iron pyrite nanocrystals described herein are highly pure and stable against surface degradation due at least in part to ligand passivation. Photovoltaic devices formed of these nanocrystals have lower dark current and can operate as more efficient solar cells. Without being bound by theory, it is believed that Zn doping reduces the density of defect states, which reduces the dark current and thus improves the efficiency of these solar cells.

A decrease in surface trap states in iron pyrite nanocrystals may also be achieved by size and shape control of the nanocrystals.

In some examples, iron pyrite nanocrystals can be printed onto a surface, e.g., to form photovoltaic layers in desired shapes, by ink-jet printing methods. The solubility of the nanocrystals in appropriate solvents can be tuned, e.g., via the size of the nanocrystals and the ligand composition.

6 Other Embodiments

Iron pyrite nanocrystals may also be used in other applications. For instance, iron pyrite is an attractive cathode material for lithium batteries, such as high temperature lithium batteries, due to its low cost, non-toxicity, abundance, and high theoretical capacity (e.g., about 900 mAh/g). Using nanostructured iron pyrite as the cathode material in thermally activated batteries (referred to herein as thermal batteries) improves the performance of the batteries. For instance, the increased surface area per unit weight of nanostructured pyrite and/or the easier diffusion of lithium into iron pyrite allows the reaction of lithium with iron pyrite to proceed further toward completion, increasing the energy density of the batteries. The power density can also be increased due to the faster charge and discharge of lithium in smaller size iron pyrite nanomaterials. In addition, thermal batteries employing nanostructured lithium cathode materials can be more compact and thus have a higher specific energy density per volume, e.g., due to lower porosity and smaller iron pyrite particles. Ligand (e.g., TOPO)-stabilized iron pyrite nanocrystals can be used even in batteries that operate at high temperatures (e.g., 400-500° C.), because the ligand stabilizes the surface of the nanocrystals against surface decomposition and prevents oxygen and moisture from oxidizing the surface of the cathode nanocrystals.

Other applications of ligand-stabilized iron pyrite nanocrystals are also possible. For instance, such nanocrystals can be used as lubricants, e.g., for bearings, in which smaller particles provide improved lubrication.

It is to be understood that the foregoing description is intended to illustrate and not to limit the scope of the invention, which is defined by the scope of the appended claims. Other embodiments are within the scope of the following claims.

What is claimed is:

1. An apparatus comprising:
    a nanocrystal particle having a size between 60 nm and 200 nm, the nanocrystal particle comprising:
        a core including $FeS_2$; and
        a coating including a ligand component chemically coordinated with both an iron atom and a sulfur atom on a surface of the core that includes the $FeS_2$, the ligand component including a phosphine oxide group that is chemically coordinated with the iron atom and the sulfur atom of the $FeS_2$,
        wherein the nanocrystal particle that includes the core including $FeS_2$ and the coating that includes the ligand component chemically coordinated with both the iron atom and the sulfur atom on the surface of the core has a cubic shape.

2. The apparatus of claim 1, wherein the ligand component includes trioctylphosphine oxide (TOPO).

3. The apparatus of claim 1, wherein the nanocrystal is stable against oxidation in air.

4. The apparatus of claim 3, wherein the nanocrystal is stable for at least one year.

5. The apparatus of claim 1, wherein a chemical composition of the nanocrystal is stable for at least one year.

6. The apparatus of claim 1, wherein the nanocrystal is a semiconductor.

7. The apparatus of claim 1, wherein a band gap of the nanocrystal is at least about 0.9 eV.

8. The apparatus of claim 1, wherein the core includes zinc.

9. The apparatus of claim 8, wherein a band gap of the nanocrystal is dependent on a ratio of iron to zinc in the core.

10. The apparatus of claim 8, wherein a band gap of the nanocrystal is at least about 1.2 eV.

11. The apparatus of claim 1, wherein the nanocrystal is soluble in an organic solvent.

12. The apparatus of claim 1, wherein the coating is disposed on all surfaces of the core.

13. The apparatus of claim 1, further comprising:
a substrate; and
a film of nanocrystal particles disposed on the substrate, each of at least some of the nanocrystal particles having a size between 60 nm and 200 nm and comprising:
a core including $FeS_2$; and
a coating including a ligand component chemically coordinated with both an iron atom and a sulfur atom on a surface of the core that includes the $FeS_2$, the ligand component including a phosphine oxide group that is chemically coordinated with the iron atom and the sulfur atom of the $FeS_2$,
wherein at least some of the nanocrystal particles that include cores including $FeS_2$, and coatings including ligand components chemically coordinated with the iron atoms and the sulfur atoms on surfaces of the cores, have cubic shapes.

14. The apparatus of claim 1, further comprising:
a substrate; and
a film of TOPO-stabilized iron pyrite nanocrystals disposed on the substrate, each of at least some of the nanocrystal particles having a size between 60 nm and 200 nm and comprising
a core including $FeS_2$, and
a coating including a ligand component that includes trioctylphosphine oxide (TOPO) that is chemically coordinated with both the iron atom and the sulfur atom of the $FeS_2$,
wherein at least some of the nanocrystal particles that include cores including $FeS_2$ and coatings including ligand components that include trioctylphosphine oxide (TOPO) that is chemically coordinated with the iron atoms and the sulfur atoms of the $FeS_2$, have cubic shapes.

15. An apparatus comprising:
a nanocrystal particle having a size between 60 nm and 200 nm, the nanocrystal particle comprising:
a core including $Fe_{1-x}Zn_xS_2$, x>0; and
a coating including a ligand component chemically coordinated with both an iron atom and a sulfur atom on a surface of the core that includes the $Fe_{1-x}Zn_xS_2$, the ligand component including a phosphine oxide group that is chemically coordinated with the iron atom and the sulfur atom of the $Fe_{1-x}Zn_xS_2$,
wherein the nanocrystal particle that includes the core including $Fe_{1-x}Zn_xS_2$, x>0, and the coating including the ligand component chemically coordinated with both the iron atom and the sulfur atom on the surface of the core, has a cubic shape.

16. The apparatus of claim 15 in which the ligand component includes trioctylphosphine oxide (TOPO).

17. The apparatus of claim 15 in which the nanocrystal is stable against oxidation in air.

18. The apparatus of claim 17 in which the nanocrystal is stable for at least one year.

19. The apparatus of claim 15 in which a chemical composition of the nanocrystal is stable for at least one year.

20. The apparatus of claim 15 in which the nanocrystal is a semiconductor.

21. The apparatus of claim 15 in which a band gap of the nanocrystal is at least about 0.9 eV.

22. The apparatus of claim 15 in which a band gap of the nanocrystal is dependent on a ratio of iron to zinc in the core.

23. The apparatus of claim 15 in which a band gap of the nanocrystal is at least about 1.2 eV.

24. The apparatus of claim 15, wherein the nanocrystal is soluble in an organic solvent.

25. The apparatus of claim 15, wherein the coating is disposed on all surfaces of the core.

26. The apparatus of claim 15, further comprising:
a substrate; and
a film of nanocrystal particles disposed on the substrate, each of at least some of the nanocrystal particles having a size between 60 nm and 200 nm and comprising:
a core including $Fe_{1-x}Zn_xS_2$, x>0; and
a coating including a ligand component chemically coordinated with both an iron atom and a sulfur atom on a surface of the core that includes the $Fe_{1-x}Zn_xS_2$, the ligand component including a phosphine oxide group that is chemically coordinated with the iron atom and the sulfur atom of the $Fe_{1-x}Zn_xS_2$,
wherein at least some of the nanocrystal particles that include cores including $Fe_{1-x}Zn_xS_2$, x>0, and coatings including ligand components chemically coordinated with the iron atoms and the sulfur atoms on surfaces of the cores, have cubic shapes.

27. The apparatus of claim 15, further comprising:
a substrate; and
a film of TOPO-stabilized iron pyrite nanocrystals disposed on the substrate, each of at least some of the nanocrystal particles having a size between 60 nm and 200 nm and comprising:
a core including $Fe_{1-x}Zn_xS_2$, x>0, and
a coating including a ligand component that includes trioctylphosphine oxide (TOPO) that is chemically coordinated with both the iron atom and the sulfur atom of the $Fe_{1-x}Zn_xS_2$,
wherein at least some of the nanocrystal particles that include cores including $Fe_{1-x}Zn_xS_2$, x>0, and coatings including ligand components that include trioctylphosphine oxide (TOPO) that is chemically coordinated with the iron atoms and the sulfur atoms of the $Fe_{1-x}Zn_xS_2$, have cubic shapes.

* * * * *